US012795914B2

(12) United States Patent
Kim et al.

(10) Patent No.: US 12,795,914 B2
(45) Date of Patent: Nov. 10, 2026

(54) NAND FLASH DEVICE

(71) Applicant: Samsung Electronics Co., Ltd., Suwon-si (KR)

(72) Inventors: Hakseon Kim, Suwon-si (KR); Nakjin Son, Suwon-si (KR); Dongjin Lee, Suwon-si (KR); Junhee Lim, Suwon-si (KR); Seongsu Kim, Suwon-si (KR); Hanmin Cho, Suwon-si (KR); Chiwoong Ham, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 317 days.

(21) Appl. No.: 18/514,158

(22) Filed: Nov. 20, 2023

(65) Prior Publication Data

US 2024/0179899 A1 May 30, 2024

(30) Foreign Application Priority Data

Nov. 30, 2022 (KR) ........................ 10-2022-0165103

(51) Int. Cl.
*H10B 41/41* (2023.01)
*G11C 16/04* (2006.01)
(Continued)

(52) U.S. Cl.
CPC ......... *H10B 41/41* (2023.02); *G11C 16/0483* (2013.01); *H10B 41/10* (2023.02);
(Continued)

(58) Field of Classification Search
CPC ........ H10B 41/41; H10B 41/10; H10B 41/27; H10B 41/35; H10B 43/10; H10B 43/27;
(Continued)

(56) References Cited

U.S. PATENT DOCUMENTS 5,473,180 A 12/1995 Ludikhuize
9,530,837 B2 12/2016 Smith
(Continued)

FOREIGN PATENT DOCUMENTS

KR 10-2000-0046747 A 7/2000
KR 10-2006-0104832 A 10/2006
(Continued)

OTHER PUBLICATIONS

Korean Office Action dated May 19, 2026 for corresponding Korean Patent Application No. 10-2022-0165103 and its English-language translation.

*Primary Examiner* — Tong-Ho Kim
(74) *Attorney, Agent, or Firm* — Harness, Dickey & Pierce, P.L.C.

(57) ABSTRACT

A NAND flash device may include a peripheral circuit including a transistor, a substrate, and a device isolation region defining an active region of the substrate. The transistor may include a first gate structure on the active region. The transistor may include source and drain regions extending in a first direction in the active region on both sides of the first gate structure, which may include a first lightly-doped source and drain region adjacent to the first gate structure and a second lightly-doped source and drain region integrally connected thereto. The second lightly-doped source and drain region may be arranged farther from the first gate structure than the first lightly-doped source and drain region. The second lightly-doped source and drain region may have a smaller width in the second direction than a width of the first lightly-doped source and drain region in the second direction.

20 Claims, 24 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |

(52) U.S. Cl.
CPC ............. *H10B 41/27* (2023.02); *H10B 41/35* (2023.02); *H10B 43/10* (2023.02); *H10B 43/27* (2023.02); *H10B 43/35* (2023.02); *H10B 43/40* (2023.02)

(58) Field of Classification Search
CPC ........ H10B 43/35; H10B 43/40; H10B 41/40; G11C 16/0483; H10D 30/601
USPC .......................................................... 257/314
See application file for complete search history.

(56) References Cited

U.S. PATENT DOCUMENTS

| | | | | |
|---|---|---|---|---|
| 10,128,342 | B2 | 11/2018 | Tsubata | |
| 2014/0048856 | A1 | 2/2014 | Song et al. | |
| 2017/0309708 | A1 | 10/2017 | Eng et al. | |
| 2022/0208787 | A1 * | 6/2022 | Baek | H10B 41/41 |

FOREIGN PATENT DOCUMENTS

| | | | |
|---|---|---|---|
| KR | 10-2018-0075373 | A | 7/2018 |
| KR | 10-2022-0016767 | A | 2/2022 |
| KR | 10-2022-0093988 | A | 7/2022 |

* cited by examiner

II - II'

NAND FLASH DEVICE

CROSS-REFERENCE TO RELATED APPLICATION

This application is based on and claims priority under 35 U.S.C. § 119 to Korean Patent Application No. 10-2022-0165103, filed on Nov. 30, 2022 in the Korean Intellectual Property Office, the disclosure of which is incorporated by reference herein in its entirety.

BACKGROUND

Inventive concepts relate to a NAND flash device and an electronic system including the NAND flash device, and more particularly, to a NAND flash device including transistors and an electronic system including the NAND flash device.

An electronic system requiring data storage is proposed to include a NAND flash device capable of storing large amounts of data, for example, a flash memory device. The flash memory device may include transistors, such as high-voltage transistors. The high-voltage transistors need to improve breakdown voltage characteristics and current characteristics.

SUMMARY

Inventive concepts provide a NAND flash device capable of improving breakdown voltage characteristics and current characteristics.

Inventive concepts provide an electronic system including a NAND flash device capable of improving breakdown voltage characteristics and current characteristics.

According to an embodiment of inventive concepts, a NAND flash device may include a peripheral circuit including a transistor, a substrate, and a device isolation region on the substrate. The device isolation region may define an active region of the substrate. The transistor may include a first gate structure on the active region. The transistor may include a plurality of source and drain regions extending in a first direction in the active region on both sides of the first gate structure. The plurality of source and drain regions may include a first lightly-doped source and drain region and a second lightly-doped source and drain region. The first lightly-doped source and drain region may be adjacent to the first gate structure and may have a first width in a second direction. The second direction may be perpendicular to the first direction. The second lightly-doped source and drain region may be integrally connected to the first lightly-doped source and drain region. The second lightly-doped source and drain region may be arranged farther from the first gate structure than the first lightly-doped source and drain region. The second lightly-doped source and drain region may have a second width in the second direction. The second width may be less than the first width.

According to an embodiment of inventive concepts, a NAND flash device may include a peripheral circuit including a plurality of transistors, a substrate, and a device isolation region on the substrate. The device isolation region may define an active region of the substrate. Each of the plurality of transistors may include a pair of gate structures arranged side by side in a first direction on the active region and a plurality of source and drain regions in the active region. The pair of gate structures may be separated from each other and may extend in a second direction. The second direction may be perpendicular to the first direction. The plurality of source and drain regions may extend respectively in the first direction and the second direction in the active region on both sides of each of the pair of gate structures. The plurality of source and drain regions may include a first lightly-doped source and drain region and a second lightly-doped source and drain region integrally connected to the first lightly-doped source and drain region. The first lightly-doped source and drain region may be in the active region on the both sides of each of the pair of gate structures, with the pair of gate structures therebetween when view from a third direction perpendicular to an upper surface of the active region. The first lightly-doped source and drain region may have a first width in the second direction. The second lightly-doped source and drain region may be arranged farther from the pair of gate structures than the first lightly-doped source and drain region. The second lightly-doped source and drain region may have a second width in the second direction. The second width may be reduced as a distance increases from the pair of gate structures.

According to an embodiment of inventive concepts, a NAND flash device may include a peripheral circuit including a plurality of transistors on a substrate; and a memory cell array configured to controlled by the peripheral circuit. The peripheral circuit may include a tapered trench in the substrate, a device isolation region in the tapered trench and defining an active region of the substrate, a pair of gate structures arranged side by side in a first direction on the active region, and a source and drain region in the active region. The pair of gate structures may be separated from each other and may extend in a second direction. The second direction may be perpendicular to the first direction. The source and drain region may extend in the first direction in the active region on both sides of each of the pair of gate structures. The source and drain region may include a lightly-doped source and drain region and a first heavily-doped source and drain region. The lightly-doped source and drain region may include a first lightly-doped source and drain region in the substrate in a region adjacent to each of the pair of gate structures and a second lightly-doped source and drain region farther from each of the pair of gate structures than the first lightly-doped source and drain region. The first heavily-doped source and drain region may be in the second lightly-doped source and drain region. The first heavily-doped source and drain region may be more heavily doped than the lightly-doped source and drain region. The first lightly-doped source and drain region may have a first width in the first direction and a second width in the second direction. The second lightly-doped source and drain region may have a third width in the first direction and a fourth width in the second direction. The first width may be less than the third width. The second width may be greater than the fourth width.

BRIEF DESCRIPTION OF THE DRAWINGS

Embodiments will be more clearly understood from the following detailed description taken in conjunction with the accompanying drawings in which.

DETAILED DESCRIPTION

Hereinafter, embodiments of inventive concepts will be described in detail with reference to the accompanying drawings. However, inventive concepts are not limited to the embodiments described below and may be embodied in various other forms. The following embodiments are provided to fully describe the scope of inventive concepts to those skilled in the art.

Figure 1:
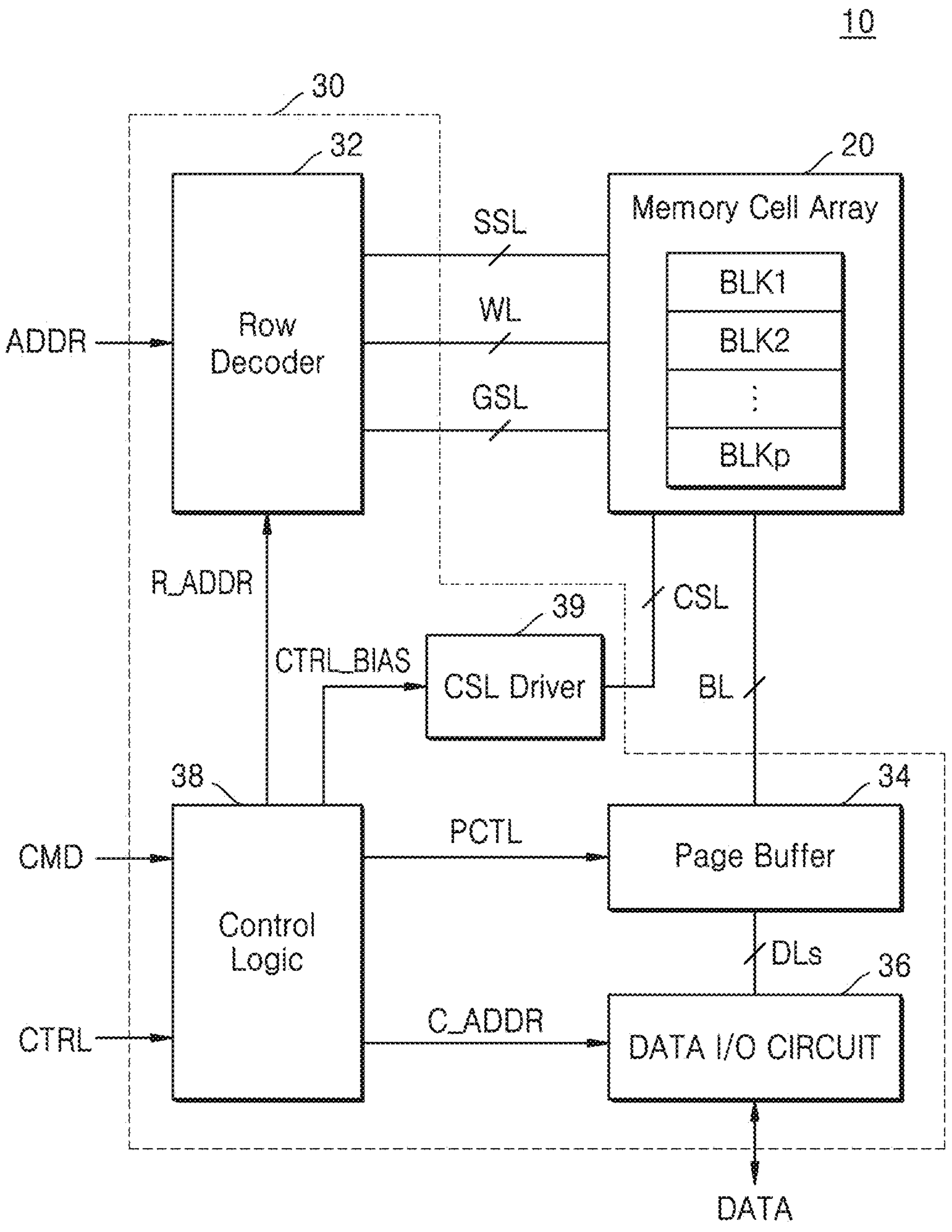
FIG. 1 is a block diagram of a NAND flash device according to an embodiment.

FIG. 1 is a block diagram of a NAND flash device according to an embodiment.

A NAND flash device 10 may include a memory cell array 20 and a peripheral circuit 30. The memory cell array 20 may be controlled by the peripheral circuit 30. The memory cell array 20 may include a plurality of memory cell blocks BLK1, BLK2, . . . , BLKp. The memory cell blocks BLK1, BLK2, . . . , BLKp may each include a plurality of memory cells. The plurality of memory cell blocks BLK1, BLK2, . . . , BLKp may be connected to the peripheral circuit 30 through a plurality of bit lines BL, a plurality of word lines WL, a plurality of string select lines SSL, and a ground select line GSL.

The peripheral circuit 30 may include a row decoder 32, a page buffer 34, a data input/output circuit 36, a control logic 38, and a common source line driver 39. The peripheral circuit 30 may further include various circuits, such as a voltage generation circuit that generates various voltages used for an operation of the NAND flash device 10, an error correction circuit that corrects errors of data read from the memory cell array 20, and an input/output interface.

In some embodiments, the respective components constituting the peripheral circuit 30 may include a plurality of transistors, for example, MOS transistors. In some embodiments, the respective components constituting the peripheral circuit 30 may include a plurality of transistors, for example, high-voltage transistors. In some embodiments, the high-voltage transistors may have breakdown voltages of about 5 V to about 10 V, or 10 V or more.

The memory cell array 20 may be connected to the row decoder 32 through the plurality of word lines WL, a string select line SSL, and a ground select line GSL and may be connected to the page buffer 34 through the plurality of bit lines BL. In the memory cell array 20, memory cells included in the memory cell blocks BLK1, BLK2, . . . , BLKp may be flash memory cells. The memory cell array 20 may include a three-dimensional (3D) memory cell array. The 3D memory cell array may include a plurality of NAND strings, and each of the NAND strings may include a plurality of memory cells connected to a plurality of vertically stacked the plurality of word lines WL.

The peripheral circuit 30 may receive an address ADDR, a command CMD, and a control signal CTRL from the outside of the NAND flash device 10 and may transmit data to and receive data from a device outside the NAND flash device 10. The row decoder 32 may select at least one of the plurality of memory cell blocks BLK1, BLK2, . . . , BLKp in response to the address ADDR from the outside and may select the word line WL, the string select line SSL, and the ground select line GSL of the selected memory cell block. The row decoder 32 may transmit a voltage for performing a memory operation to the plurality of word lines WL of the selected memory cell block.

The page buffer 34 may be connected to the memory cell array 20 through the plurality of bit lines BL. The page buffer 34 operates as a write driver during a program operation to apply a voltage according to data DATA to be stored in the memory cell array 20 to the plurality of bit lines BL, and during a read operation, the page buffer 34 may operate as a sense amplifier to sense the data DATA stored in the memory cell array 20. The page buffer 34 may operate in response to a control signal PCTL provided from the control logic 38.

The data input/output circuit 36 may be connected to the page buffer 34 through a plurality of data lines DLs. The data input/output circuit 36 may receive the data DATA from a memory controller (not illustrated) during a program operation, and may provide the data DATA to the page buffer 34 based on a column address C_ADDR provided from the control logic 38. During a read operation, the data input/output circuit 36 may provide read data DATA stored in the page buffer 34 to the memory controller based on the column address C_ADDR provided from the control logic 38.

The data input/output circuit 36 may transmit an address or a command which are input to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and provide the column address C_ADDR to the data input/output circuit 36. The control logic 38 may generate various internal control signals used in the NAND flash device 10 in response to the control signal CTRL. For example, the control logic 38 may adjust levels of voltages provided to the plurality of word lines WL and the plurality of bit lines BL when a memory operation, such as a program operation or an erase operation, is performed.

The common source line driver 39 may be connected to the memory cell array 20 through a common source line CSL. The common source line driver 39 may apply a common source voltage (for example, a power supply voltage) or a ground voltage to the common source line CSL in response to a bias signal CTRL_BIAS of the control logic 38.

Figure 2:
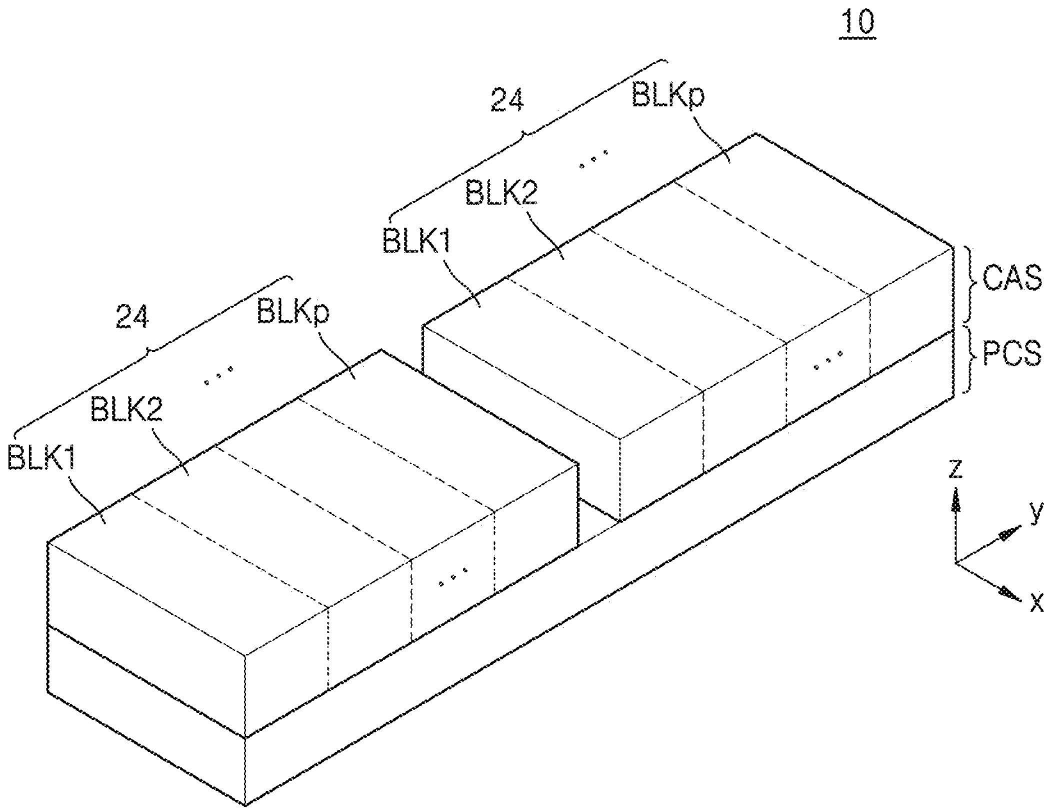
FIG. 2 is a schematic perspective view of a NAND flash device according to an embodiment.

FIG. 2 is a schematic perspective view of a NAND flash device according to an embodiment.

The NAND flash device 10 may include a cell array structure CAS and a peripheral circuit structure PCS overlapping each other in a vertical direction (a Z direction and a third direction). A horizontal direction (an X direction or a −X direction) may be referred to as a first direction. The horizontal direction (a Y direction or a −Y direction) may be referred to as a second direction. The cell array structure CAS may include the memory cell array 20 of FIG. 1.

In some embodiments, the peripheral circuit structure PCS may include a plurality of transistors, for example, MOS transistors. In some embodiments, the peripheral circuit structure PCS may include a plurality of transistors, such as high-voltage transistors. In some embodiments, the high-voltage transistors may have breakdown voltages of about 5 V to about 10 V, or 10 V or more. The peripheral circuit structure PCS may include the peripheral circuit 30 of FIG. 1.

The cell array structure CAS may include a plurality of tiles 24. Each of the plurality of tiles 24 may include a plurality of memory cell blocks BLK1, BLK2, . . . , BLKp. Each of the plurality of memory cell blocks BLK1, BLK2, . . . , BLKp may include three-dimensionally arranged memory cells.

Figure 3:
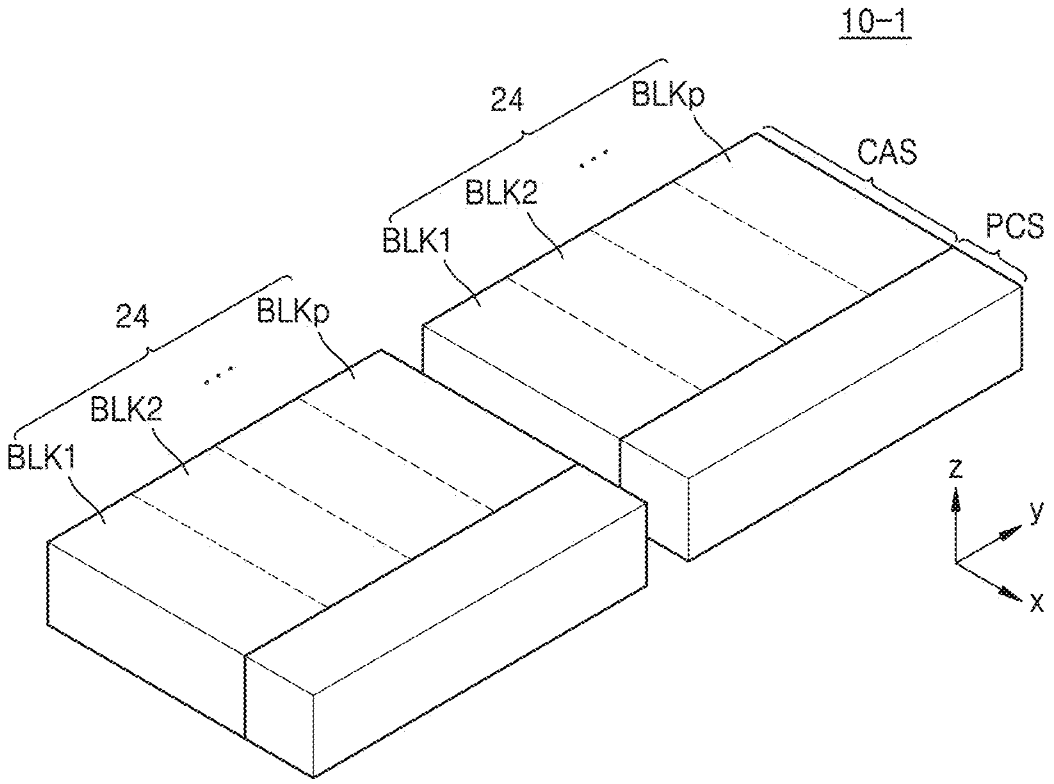
FIG. 3 is a schematic perspective view of a NAND flash device according to an embodiment.

FIG. 3 is a schematic perspective view of a NAND flash device according to an embodiment.

A NAND flash device 10-1 may include a cell array structure CAS and a peripheral circuit structure PCS arranged in a horizontal direction (the X direction and the first direction). Unlike FIG. 3, the peripheral circuit structure PCS may be arranged in a horizontal direction (the −X direction and the first direction). The horizontal direction (the Y direction or the −Y direction) may be referred to as the second direction, and the vertical direction (the Z direction) may be referred to as the third direction.

The cell array structure CAS may include the memory cell array 20 of FIG. 1. In some embodiments, the peripheral circuit structure PCS may include a plurality of transistors described in FIG. 2, for example, MOS transistors or high-voltage transistors. The peripheral circuit structure PCS may include the peripheral circuit 30 of FIG. 1.

The cell array structure CAS may include a plurality of tiles 24 illustrated in FIG. 2. Each of the plurality of tiles 24 may include a plurality of memory cell blocks BLK1, BLK2, . . . , BLKp. Each of the memory cell blocks BLK1, BLK2, . . . , BLKp may include three-dimensionally arranged memory cells.

Figure 4:
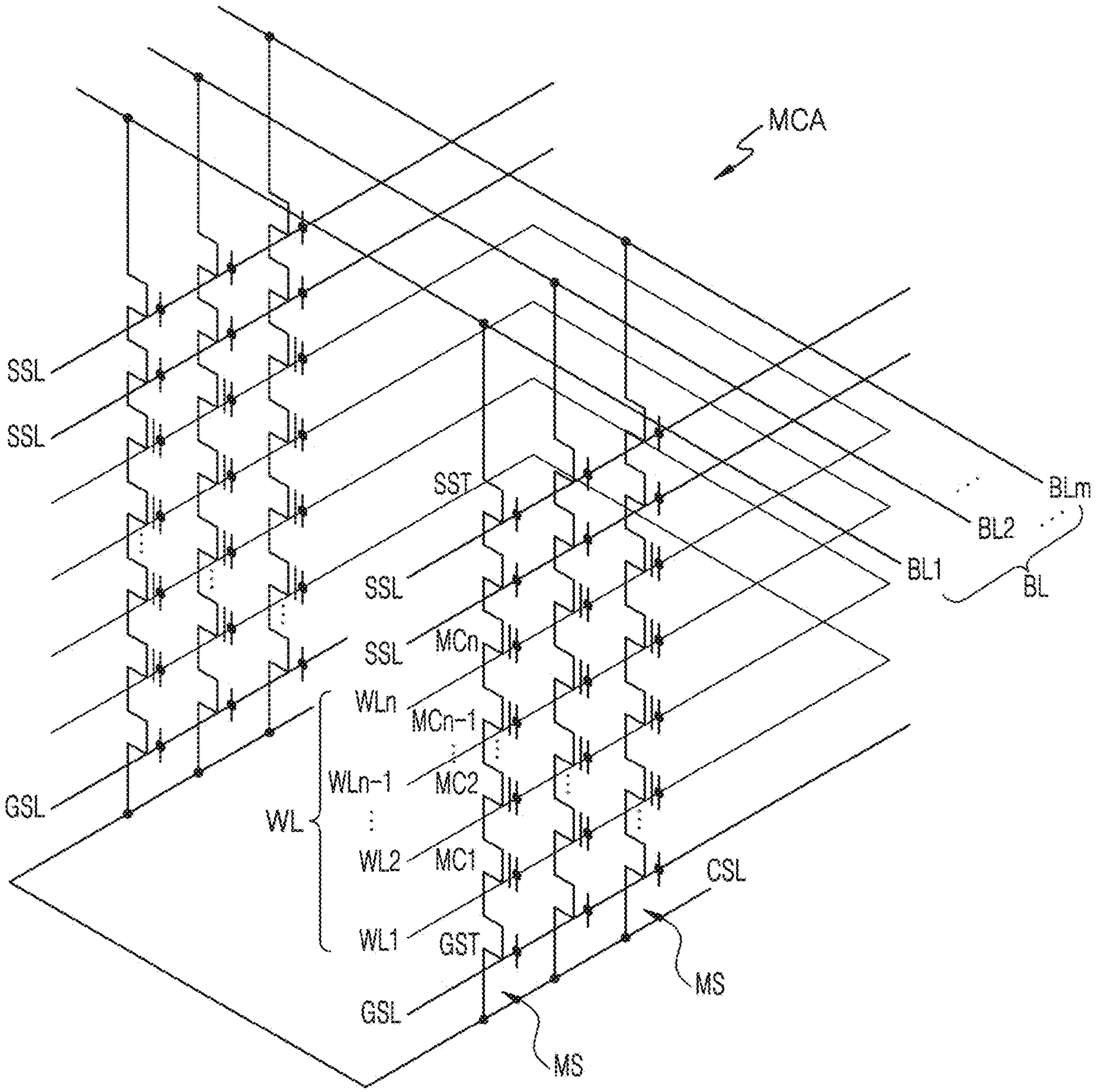
FIG. 4 is an equivalent circuit diagram of a memory cell array (MCA) of a NAND flash device according to an embodiment.

FIG. 4 is an equivalent circuit diagram of a memory cell array MCA of a NAND flash device according to an embodiment.

An equivalent circuit diagram of a vertical NAND flash memory device having a vertical channel structure is illustrated in FIG. 4. Each of the memory cell blocks BLK1. BLK2, . . . , BLKp of FIGS. 1 to 3 may include the memory cell array MCA having the circuit configuration illustrated in FIG. 4.

The memory cell array MCA may include a plurality of memory cell strings MS. The memory cell array MCA includes a plurality of bit lines BL or BL1, BL2, . . . , BLm, a plurality of word lines WL or WL1, WL2 . . . , WLn−1, WLn, at least one string select line SSL, at least one ground select line GSL, and a common source line CSL.

A plurality of memory cell strings MS may be formed between the plurality of bit lines BL and the common source line CSL. Although FIG. 4 illustrates a case in which each of the plurality of memory cell strings MS includes one ground select line GSL and two string select lines SSL, inventive concepts are not limited thereto. For example, each of the plurality of memory cell strings MS may also include one string select line SSL.

Each of the plurality of memory cell strings MS may include a string select transistor SST, a ground select transistor GST, and a plurality of memory cell transistors MC1, MC2, . . . , MCn−1, MCn. A drain region of the string select transistor SST may be connected to the bit line BL, and a source region of the ground select transistor GST may be connected to the common source line CSL. The common source line CSL may be connected in common to source regions of a plurality of ground select transistors GST.

The string select transistor SST may be connected to the string select line SSL, and the ground select transistor GST may be connected to the ground select line GSL. Each of the plurality of memory cell transistors MC1, MC2, . . . , MCn−1, MCn may be connected to the word lines WL.

Figure 5:
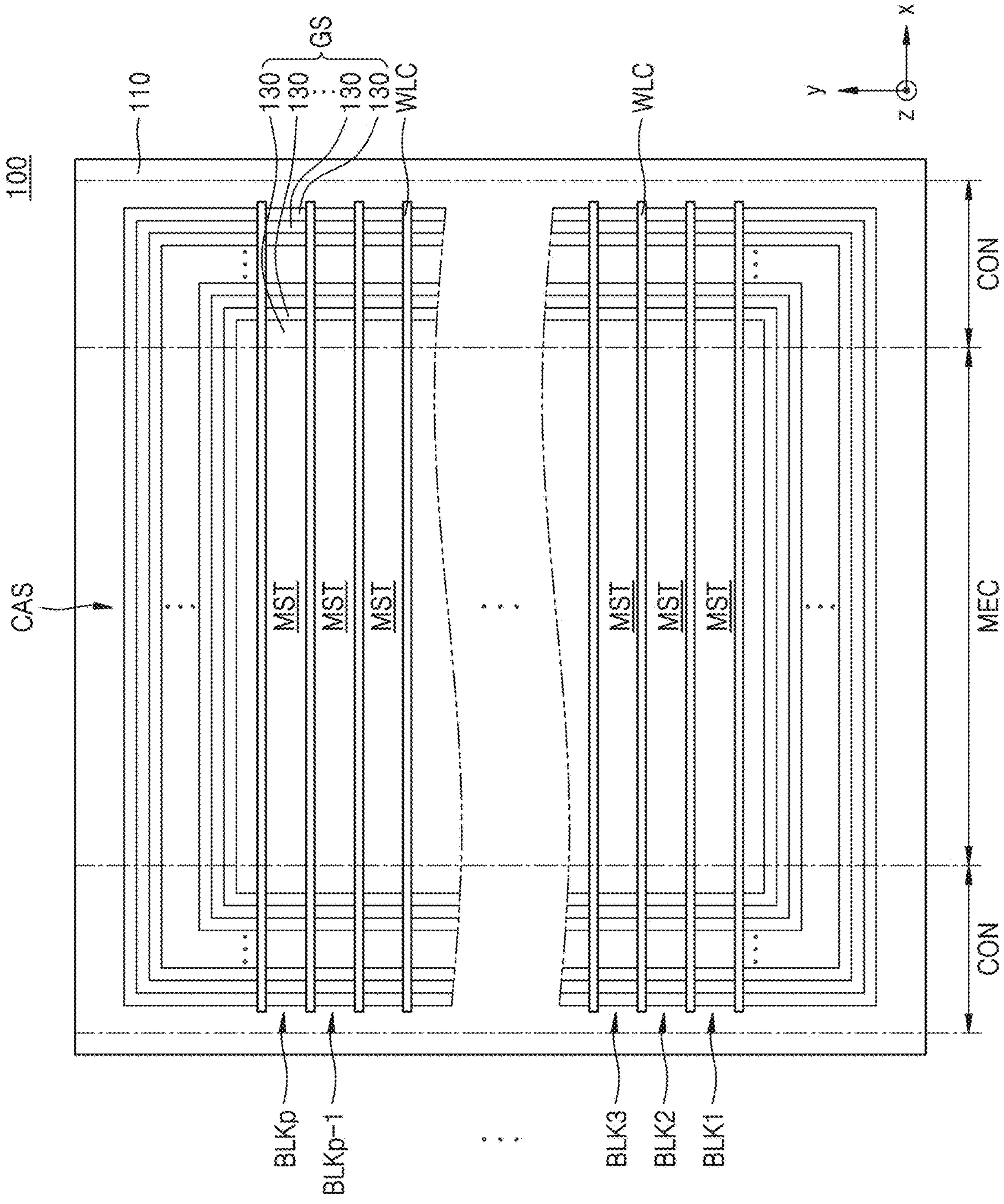
FIG. 5 is a schematic plan view of a partial region of a NAND flash device according to an embodiment.

FIG. 5 is a schematic plan view of a partial region of a NAND flash device according to an embodiment.

A cell array structure CAS of a NAND flash device 100 may include an upper substrate 110 and a plurality of memory cell blocks BLK1, BLK2, . . . , BLKp on the upper substrate 110.

The peripheral circuit structure PCS illustrated in FIG. 2 may be under the upper substrate 110. The plurality of memory cell blocks BLK1, BLK2, . . . , BLKp may overlap the peripheral circuit structure PCS in the vertical direction (the Z direction and the third direction) with the upper substrate 110 therebetween. The peripheral circuit structure PCS under the upper substrate 110 may include the peripheral circuit 30 of FIG. 1.

The cell array structure CAS may include a memory cell region MEC and connection regions CON on both sides of the memory cell region MEC in the horizontal direction (the X direction). Each of the plurality of memory cell blocks BLK1, BLK2, . . . , BLKp may include a memory stack structure MST extending in the horizontal direction (the X direction) across the memory cell region MEC and the connection regions CON.

The memory stack structure MST may include a plurality of gate lines 130 stacked to overlap each other in the vertical direction (the Z direction and the third direction) in the memory cell region MEC and the connection regions CON on the upper substrate 110. In each of the plurality of memory stack structures MST, the plurality of gate lines 130 may constitute a gate stack GS.

In each of the plurality of memory stack structures MST, the plurality of gate lines 130 may constitute the ground select line GSL, a plurality of word lines WL, and the string select line SSL of FIG. 4. Areas of the plurality of gate lines 130 in the X-Y plane may be gradually reduced as a distance from the upper substrate 110 increases. A central portion of each of the plurality of gate lines 130 overlapping each other in the vertical direction (the Z direction and the third direction) may constitute the memory cell region MEC, and an edge portion of each of the plurality of gate lines 130 may constitute the connection regions CON.

A plurality of word line cut structures WLC extending in the horizontal direction (the X direction) in the memory cell region MEC and the connection regions CON may be on the upper substrate 110. The plurality of word line cut structures WLC may be separated from each other in the horizontal direction (the Y direction and the second direction). The plurality of memory cell blocks BLK1, BLK2, . . . , BLKp may be arranged one by one between the plurality of word line cut structures WLC.

Figure 6:
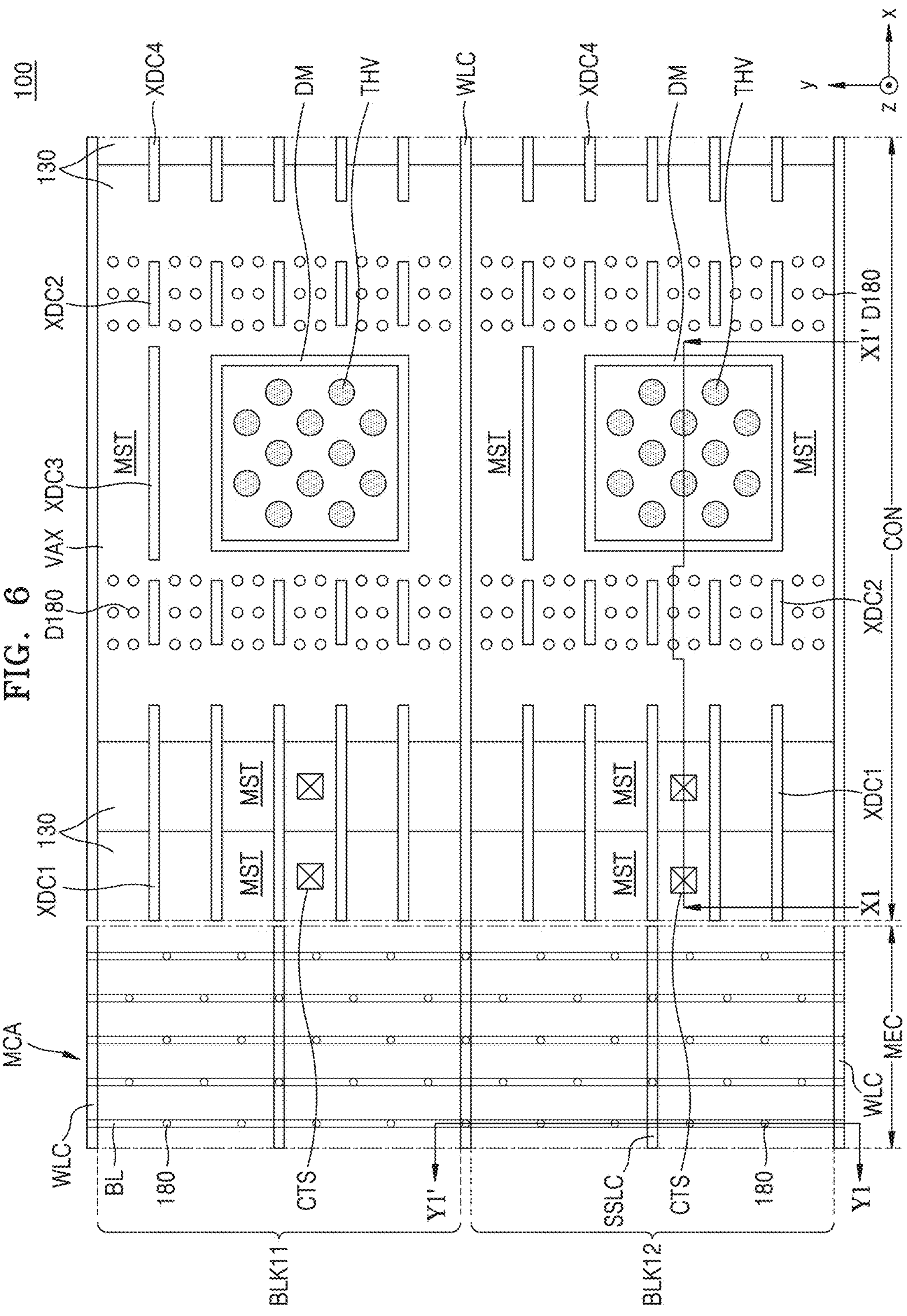
FIGS. 6 to 8 are views illustrating in detail a NAND flash device according to an embodiment.
Figure 7:
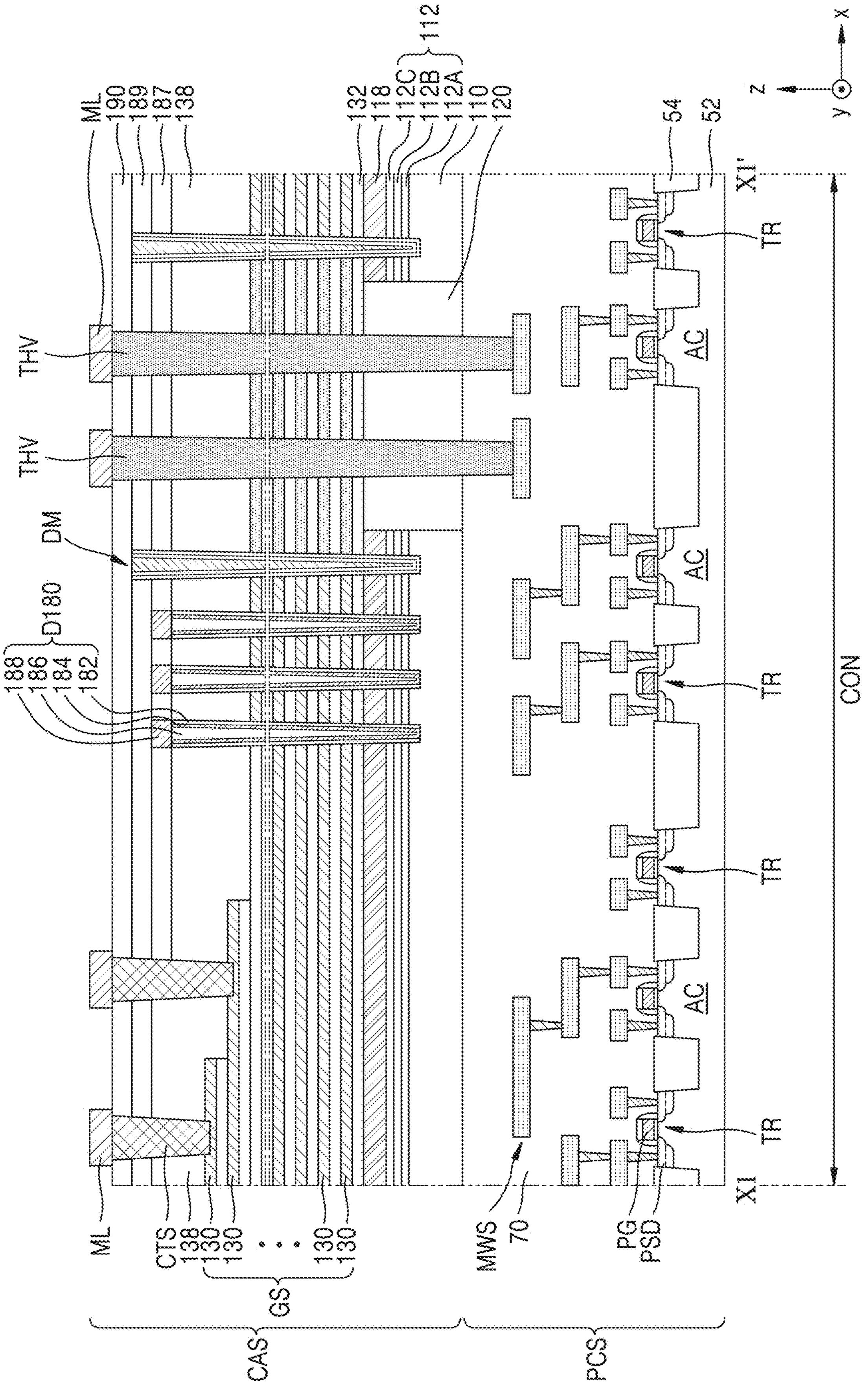
Figure 8:
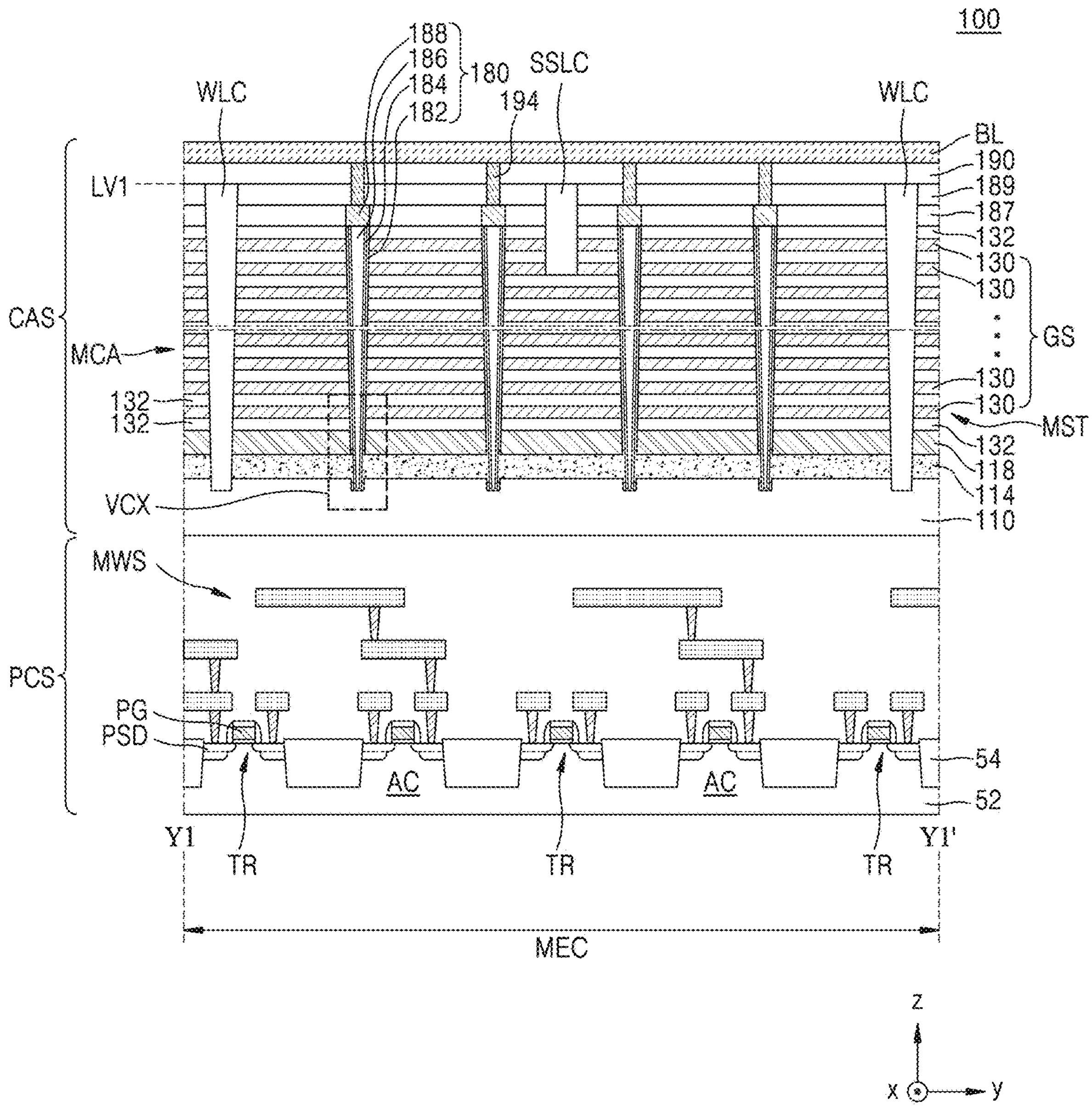

FIGS. 6 to 8 are views illustrating in detail a NAND flash device according to an embodiment.

FIG. 6 is a plan view illustrating some configurations of the memory cell blocks BLK11 and BLK12 that may respectively constitute the plurality of memory cell blocks BLK1, BLK2, . . . , BLKp in FIG. 5. FIG. 7 is an enlarged cross-sectional view of some components taken along line X1'X1' in FIG. 6. FIG. 8 is an enlarged cross-sectional view of some components taken along line Y1'Y1' in FIG. 6.

Referring to FIGS. 6 to 8, the NAND flash device 100 may include a peripheral circuit structure PCS and a cell array structure CAS arranged on the peripheral circuit structure PCS and overlapping the peripheral circuit structure PCS in the vertical directions (the Z direction and the third direction) as illustrated in FIG. 2.

The cell array structure CAS may include an upper substrate 110, an insulating plate 112, a first conductive plate 114, a second conductive plate 118, and a memory stack structure MST. The first conductive plate 114, the second conductive plate 118, and the memory stack structure MST may be sequentially stacked on the upper substrate 110 in the memory cell region MEC of the cell array structure CAS. The insulating plate 112, the second conductive plate 118, and the memory stack structure MST may be sequentially stacked on the upper substrate 110 in the connection region CON of the cell array structure CAS. The insulating plate 112 may include sub-insulating plate layers 112A, 112B, and 112C.

The first conductive plate 114 and the second conductive plate 118 may function as the common source line CSL of FIG. 4. The first conductive plate 114 and the second conductive plate 118 may function as a source region for supplying a current to vertical memory cells included in the cell array structure CAS.

In some embodiments, the upper substrate 110 may be formed of a semiconductor material, such as polysilicon. Each of the first conductive plate 114 and the second conductive plate 118 may be composed of a doped polysilicon layer, a metal layer, or a combination thereof. The metal layer may be formed of tungsten (W) but is not limited thereto.

The memory stack structure MST may include a gate stack GS. The gate stack GS may include a plurality of gate lines 130 extending parallel to each other in the horizontal direction (the X direction) and overlapping each other in the vertical direction (the Z direction). Each of the plurality of gate lines 130 may be formed of a metal, metal silicide, a semiconductor doped with an impurity, or a combination thereof. For example, each of the plurality of gate lines 130 may include a metal, such as tungsten, nickel, cobalt, or tantalum, metal silicide, such as tungsten silicide, nickel silicide, cobalt silicide, or tantalum silicide, doped polysilicon, or a combination thereof.

An insulating layer 132 may be between the second conductive plate 118 and the plurality of gate lines 130 and may be between the plurality of gate lines 130. The uppermost gate line 130 among the plurality of gate lines 130 may be covered with the insulating layer 132. The insulating layer 132 may be formed of silicon oxide.

A plurality of word line cut structures WLC may extend in the horizontal direction (the X direction) on the upper substrate 110 in the memory cell region MEC and the connection region CON. A width of each of the plurality of gate lines 130 included in the memory cell blocks BLK11 and BLK12 in the horizontal direction (the Y direction) may be limited by the plurality of word line cut structures WLC.

Each of the plurality of word line cut structures WLC may be composed of an insulating structure. In some embodiments, the insulating structure may be formed of silicon oxide, silicon nitride, silicon oxynitride, or a low-k material. For example, the insulating structure may be composed of a silicon oxide layer, a silicon nitride layer, a SiON layer, a SiOCN layer, a SiCN layer, or a combination thereof. In some embodiments, at least a part of the insulating structure may include an air gap. As used herein, a term "air" may indicate the atmosphere or other gases that may be present during a manufacturing process.

The plurality of gate lines 130 constituting one gate stack GS may be stacked to overlap each other in the vertical direction (the Z direction) over the second conductive plate 118 between two adjacent word line cut structures WLC. The plurality of gate lines 130 constituting one gate stack GS may include the ground select line GSL, the plurality of word lines WL, and the string select line SSL illustrated in FIG. 4. The peripheral circuit structure PCS may include a semiconductor substrate 52, isolation regions 54 in trenches of the semiconductor substrate 52 and defining active regions AC. Transistors TR may be formed on the semiconductor substrate 52 and may be separated by the isolation regions 54. The transistors TR may include gate electrodes PG and source and drain doping regions PSD in the substrate. An insulating layer 70 may be formed on the semiconductor substrate 52 and may include metal interconnection layers MWS connected to the transistors. Some metal interconnection layers MWS may be connected to through vias THV that extend in a vertical direction through the cell array structure CAS into the insulating layer 70. The through vias THV may be connected to metal layers ML on insulating layers 187, 189, and 190 surrounding an upper region of the through vias THV. Some metal layers ML may be connected to gate lines 130 through contact structures CTS. A insulating film 138 may be below the insulating layers 187, 189, and 190 and may be on the cell array structure CAS.

As illustrated in FIG. 8, the upper two gate lines 130 among the plurality of gate lines 130 may be separated in the horizontal direction (the Y direction) with a string select line cut structure SSLC therebetween. The two gate lines 130 separated from each other with the string select line cut structure SSLC therebetween may respectively constitute the string select lines SSL described with reference to FIG. 4.

Although FIG. 8 illustrates a case in which one string select line cut structure SSLC is formed on one gate stack GS, but inventive concepts are not limited to the case illustrated in FIG. 8. For example, at least two string select line cut structures SSLC may also be formed on one gate stack GS. The string select line cut structure SSLC may be filled with an insulating layer. In some embodiments, the string select line cut structure SSLC may include an insulating layer formed of an oxide layer, a nitride layer, or a combination thereof. In some embodiments, at least a part of the string select line cut structure SSLC may include an air gap.

As illustrated in FIGS. 6 and 8, a plurality of channel structures 180 may extend in the vertical direction (the Z direction) by penetrating the plurality of gate lines 130, a plurality of insulating layers 132, the second conductive plate 118, and the first conductive plate 114 on the upper substrate 110 in the memory cell region MEC. The plurality of channel structures 180 may be separated from each other with a desired and/or alternatively preset gap therebetween in the horizontal direction (the X direction) and the horizontal direction (the Y direction). Each of the plurality of channel structures 180 may include a gate dielectric layer 182, a channel region 184, a buried insulating layer 186, and a drain region 188.

FIGS. 9A to 9D are a plan view and cross-sectional views illustrating a transistor included in a NAND flash device, according to an embodiment.

Figure 9A:
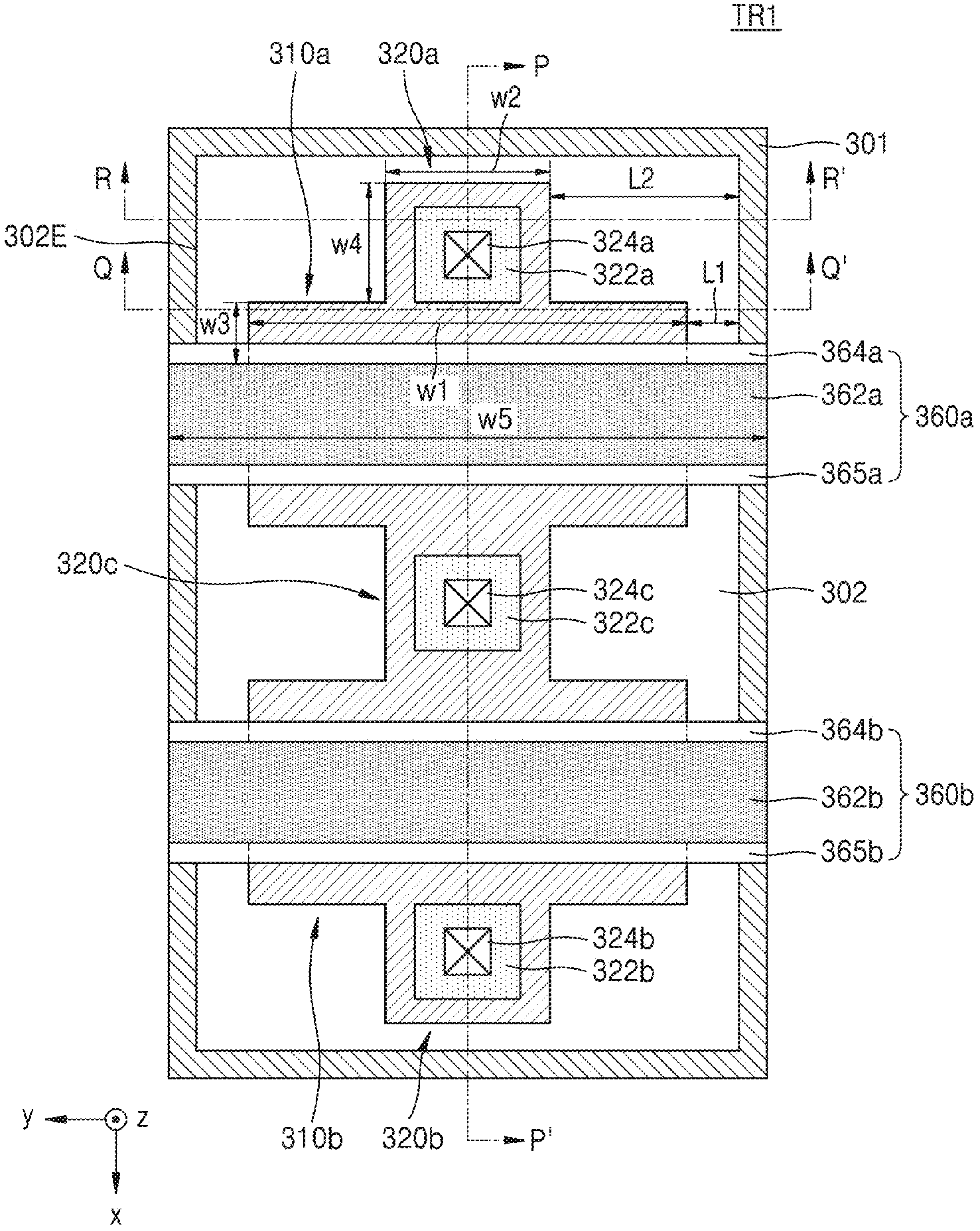
FIGS. 9A to 9D are a plan view and cross-sectional views illustrating a transistor included in a NAND flash device, according to an embodiment.

FIGS. 9A to 9D may be views illustrating a transistor TR1 included in NAND flash devices 10, 10-1, and 100 described above. In FIG. 9A, a first direction (an x direction) may be a channel length direction, and a second direction (a y direction) may be a channel width direction.

Figure 9B:
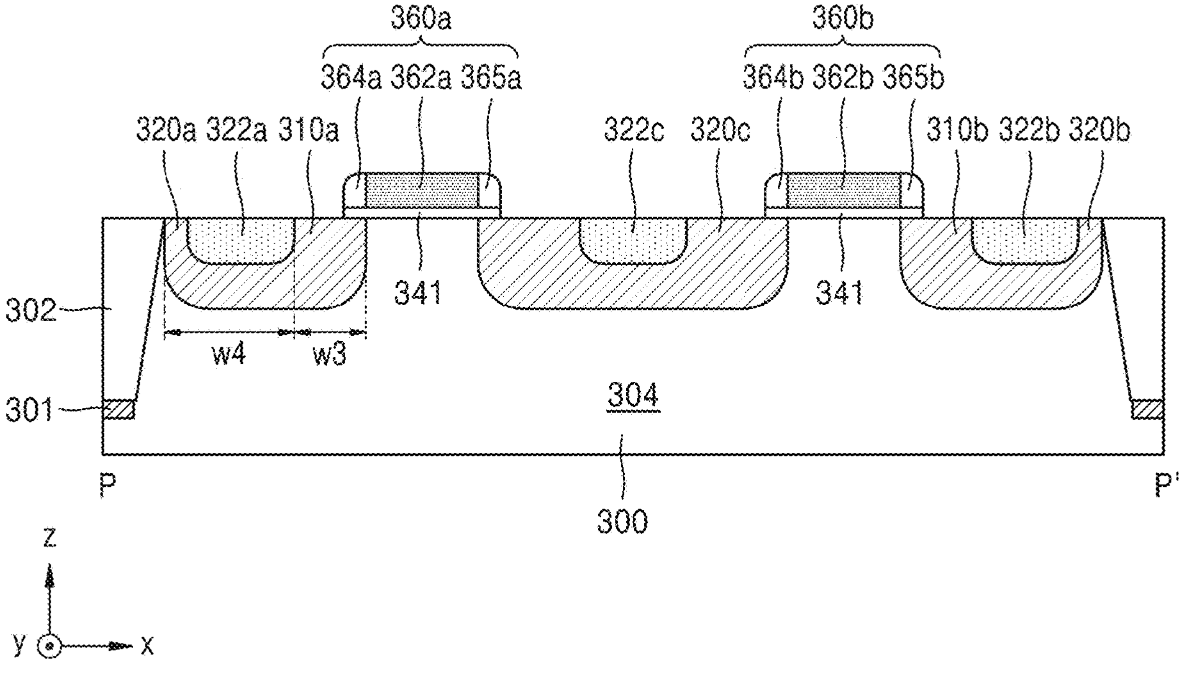
Figure 9C:
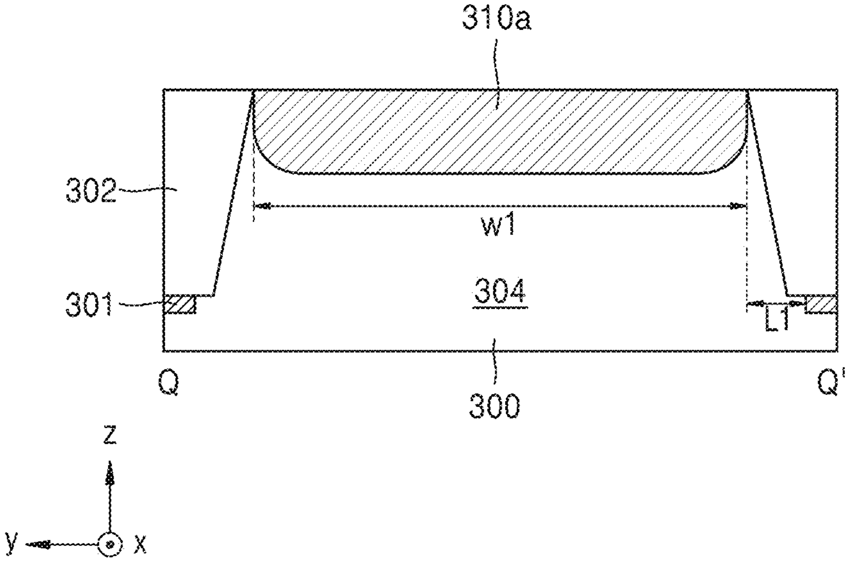
Figure 9D:
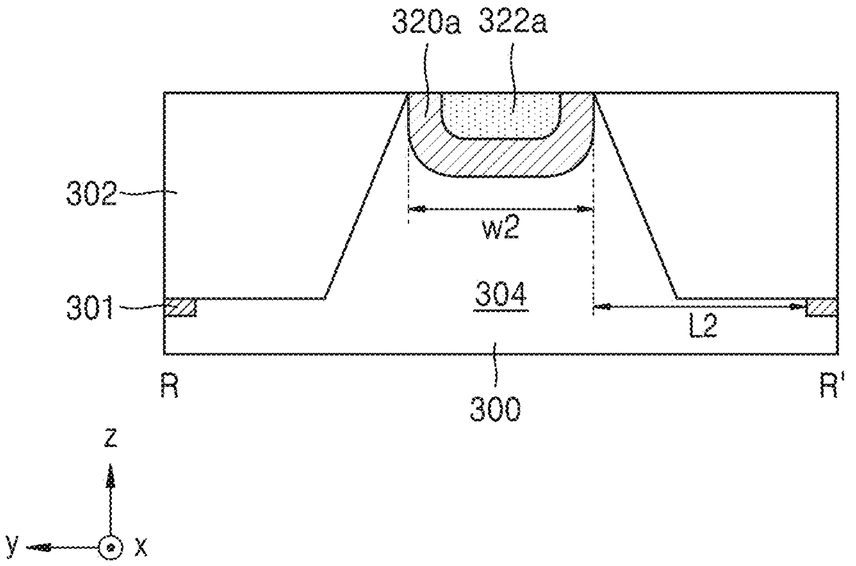

FIG. 9A is a plan view of the transistor TR1 according to an embodiment, and FIG. 9B is a cross-sectional view taken along line P-P' of FIG. 9A. In addition, FIG. 9C is a cross-sectional view taken along line Q-Q' of FIG. 9A, and FIG. 9D is a cross-sectional view taken along line R-R' of FIG. 9A.

Referring to FIGS. 9A and 9B, a device isolation region 302 may be in a substrate 300. In this case, an active region 304 may be defined in the substrate 300 by the device isolation region 302. The device isolation region 302 may limit and/or prevent electrons in the active region 304 from flowing to other transistors or devices. According to one embodiment, the device isolation region 302 may include silicon oxide.

A first gate structure 360*a* may be separated from and a second gate structure 360*b* in the first direction (the x direction) on the active region 304 defined by the device isolation region 302. As illustrated in FIG. 9A, the first gate structure 360*a* may be on the left side in the first direction (the x direction), and the second gate structure 360*b* may be on the right side in the first direction (the x direction).

A plurality of source and drain doping regions (hereinafter, referred to PSD of FIG. 8) may be adjacent to both sides of the first gate structure 360*a* and the second gate structure 360*b*, and may include first lightly-doped source and drain regions 310*a* and 310*b* having a first width w1 in a second direction (a y direction) perpendicular to the first direction (the x direction) and a third width w3 in the first direction (the x direction). The first lightly-doped source and drain regions 310*a* and 310*b*, which are very lightly doped, may be formed under the first gate structure 360*a* and the second gate structure 360*b* to limit and/or prevent a hot carrier effect by intentionally reducing speeds of electrons moving along a channel layer that may be formed in lower ends of the first gate structure 360*a* and the second gate structure 360*b*.

In addition, the plurality of source and drain doping regions PSD may be integrally connected to the first lightly-doped source and drain regions 310*a* and 310*b*, and may include second lightly-doped source and drain regions 320*a* and 320*b* farther than the first lightly-doped source and drain regions 310*a* and 310*b* from the first gate structure 360*a* and the second gate structure 360*b*. The second lightly-doped source and drain regions 320*a* and 320*b* may have areas different from areas of the first lightly-doped source and drain regions 310*a* and 310*b*. The second lightly-doped source and drain regions 320*a* and 320*b* may have a width w2 in a second direction (the y direction) that is less than a first width w1 of the first lightly-doped source and drain regions 310*a* and 310*b*. In addition, the second lightly-doped source and drain regions 320*a* and 320*b* may have a fourth width w4 in a first direction (the x direction) greater than a third width w3 of the first lightly-doped source and drain regions 310*a* and 310*b*. However, inventive concepts are not limited thereto, and the fourth width w4 may be equal to or less than the third width w3 depending on embodiments. Hereinafter, the same width described herein means the same width or a similar width within a measurement error range. In this case, the second lightly-doped source and drain regions 320*a* and 320*b* may function the same as the first lightly-doped source and drain regions 310*a* and 310*b*.

The first lightly-doped source and drain regions 310*a* and 310*b* and the second lightly-doped source and drain regions 320*a* and 320*b* may be doped with an impurity of a conductivity type opposite to a conductive type of the active region 304. In some embodiments, the active region 304 may be doped with a p-type impurity, and the first lightly-doped source and drain regions 310*a* and 310*b* and the second lightly-doped source and drain regions 320*a* and 320*b* may be doped with an n-type impurity. The first lightly-doped source and drain regions 310*a* and 310*b* and the second lightly-doped source and drain regions 320*a* and 320*b* may be referred to as lightly-doped drain (LDD) regions.

According to an embodiment, the plurality of source and drain doping regions PSD may include first heavily-doped source and drain regions 322*a* and 322*b* buried in the second lightly-doped source and drain regions 320*a* and 320*b*. The first heavily-doped source and drain regions 322*a* and 322*b* may be more heavily-doped with an impurity than the first lightly-doped source and drain regions 310*a* and 310*b* and the second lightly-doped source and drain regions 320*a* and 320*b*.

In some embodiments, the first lightly-doped source and drain regions 310*a* and 310*b* and the second lightly-doped source and drain regions 320*a* and 320*b* may be doped with phosphorus or arsenic at a doping concentration of about 5 $e^{16}/cm^3$ to about 5 $e^{17}/cm^3$. In some embodiments, the first heavily-doped source and drain regions 322*a* and 322*b* may be doped with phosphorus or arsenic at a doping concentration of about 1 $e^{19}/cm^3$ to about 1 $e^{20}/cm^3$.

The transistor TR1 may include source and drain contacts 324*a* and 324*b* that are on the first heavily-doped source and drain regions 322*a* and 322*b* and configured to apply voltages to the first heavily-doped source and drain regions 322*a* and 322*b*. Although FIG. 9A illustrates only one source and drain contact 324*a* and only one source and drain contact 324*b*, a plurality of source and drain contacts 324*a* may be on the first heavily-doped source and drain region 322*a*, and a plurality of source and drain contacts 324*b* may be on the first heavily-doped source and drain region and 322*b*.

As illustrated in FIG. 9A, the transistor TR1 may include an isolation impurity region 301 surrounding the first lightly-doped source and drain regions 310*a* and 310*b* and the second lightly-doped source and drain regions 320*a* and 320*b* when viewed in a third direction (the z direction) perpendicular to an upper surface of the active region 302. The isolation impurity region 301 may be separated from the first lightly-doped source and drain regions 310*a* and 310*b* and the second lightly-doped source and drain regions 320*a* and 320*b* by a desired and/or alternatively preset distance.

The first lightly-doped source and drain regions 310*a* and 310*b* may be separated from the isolation impurity region 301 in a second direction (the y direction) by a first separation distance L1. In addition, the second lightly-doped source and drain regions 320*a* and 320*b* may be separated from the isolation impurity region 301 in the second direction (the y direction) by a second separation distance L2. The first separation distance L1 in the second direction (the y direction) may be less than the second separation distance L2. In some embodiments, the first separation distance L1 and the second separation distance L2 may each be several nm. In some embodiments, the first separation distance L1 and the second separation distance L2 may each be about 100 nm to about 500 nm.

When the second lightly-doped source and drain regions 320*a* and 320*b* are separated from the isolation impurity region 301 by the second separation distance L2, an electric field in the separation impurity region 301 may be limited and/or prevented from increasing during an operation of the transistor TR1, and thus, a breakdown voltage of the transistor TR1 may be limited and/or prevented from being lowered.

According to an embodiment, the first gate structure 360*a* and the second gate structure 360*b* may have a fifth width w5 in the second direction (the y direction). In this case, the fifth width w5 may be greater than the second width w2 of the second lightly-doped source and drain regions 320*a* and 320*b*. Although FIG. 9A illustrates that the first gate structure 360*a* and the second gate structure 360*b* completely overlap the isolation impurity region 301 in the second direction (the y direction), the first gate structure 360*a* and the second gate structure 360*b* may overlap or may not overlap a partial region of the impurity region 301 depending on embodiments. Regardless of whether the first gate structure 360*a* and the second gate structure 360*b* overlap the isolation impurity region 301, the second lightly-doped source and drain regions 320*a* and 320*b* may be far away from the isolation impurity region 301 by having a less width in the direction than the first gate structures 360*a* and the second gate structure 360*b*.

A third lightly-doped source and drain region 320*c* may be between the first gate structure 360*a* and the second gate structure 360*b*. A source and drain contact 324*c*, which is on a second heavily-doped source and drain region 322*c* and configured to apply a voltage to the second heavily-doped source and drain region 322*c*, may be in the third lightly-doped source and drain region 320*c*. The third lightly-doped source and drain region 320*c*, the second heavily-doped source and drain region 322*c*, and the source and drain contact 324*c* may be formed of respectively substantially the same materials as the second lightly-doped source and drain regions 320*a* and 320*b*, the first heavily-doped source and drain regions 322*a* and 322*b*, and the source and drain contacts 324*a* and 324*b*. However, the first gate structures 360*a* and the second gate structure 360*b* may share the third lightly-doped source and drain region 320*c*, the second heavily-doped source and drain region 322*c*, and the source and drain contact 324*c*.

Referring to FIG. 9B, the device isolation region 302 may be in a tapered trench. In addition, the plurality of source and drain doping regions PSD may be surrounded by the device isolation region 302. In addition, partial regions of the first lightly-doped source and drain regions 310*a* and 310*b* may respectively vertically overlap the first gate structures 360*a* and the second gate structure 360*b*.

Referring to FIGS. 9A, 9C, and 9D, the first lightly-doped source and drain regions 310*a* and 310*b* may be separated from the isolation impurity region 301 by the first separation distance L1, and the second lightly-doped source and drain regions 320*a* and 320*b* may be separated from the isolation impurity region 301 by the second separation distance L2. In this case, the second separation distance L2 may be greater than the first separation distance L1.

The first lightly-doped source and drain regions 310*a* and 310*b* and the second lightly-doped source and drain regions 320*a* and 320*b* may include an impurity of the first conductivity type. In addition, the isolation impurity region 301 may include an impurity of a second conductivity type different from the first conductivity type. For example, when the first lightly-doped source and drain regions 310*a* and 310*b* and the second lightly-doped source and drain regions 320*a* and 320*b* are doped with an n-type impurity, the isolation impurity region 301 may be doped with a $p^+$-type impurity. This may also be applied in the opposite case.

The isolation impurity region 301 may be under a lower surface of the device isolation region 302 formed in a trench. As described above, when the second lightly-doped source and drain regions 320*a* and 320*b* are separated from the isolation impurity region 301 by the second separation distance L2, an electric field in the isolation impurity region 301 may be limited and/or prevented from increasing during an operation of the transistor TR1, and thus, it is possible to limit and/or prevent a breakdown voltage of the transistor TR1 from being lowered.

The first gate structure 360*a* may include a first gate 362*a* and first spacers 364*a* and 365*a* on both sides of the first gate 362*a*. Similarly, the second gate structure 360*b* may include a second gate 362*b* and second spacers 364*b* and 365*b* on both sides of the second gate 362*b*. The first lightly-doped source and drain regions 310*a* and 310*b* may respectively vertically overlap at least partial regions of the first spacers 364*a* and 365*a* and the second spacers 364*b* and 365*b*.

FIGS. 10A to 10D are a plan view and cross-sectional views illustrating a transistor included in a NAND flash device, according to another embodiment.

FIGS. 10A to 10D may illustrate one transistor TR2 among the transistors TR included in the NAND flash devices 10, 10-1, and 100 described above. FIGS. 10A to 10D may illustrate the one transistor TR2 among the transistors TR included in a peripheral circuit (for example, 30 in FIG. 1) in the peripheral circuit structure PCS of the NAND flash devices 10, 10-1, and 100 described above. In FIGS. 10A to 10D, the descriptions previously given with reference to FIGS. 9A to 9D are briefly described or omitted.

Figure 10A:
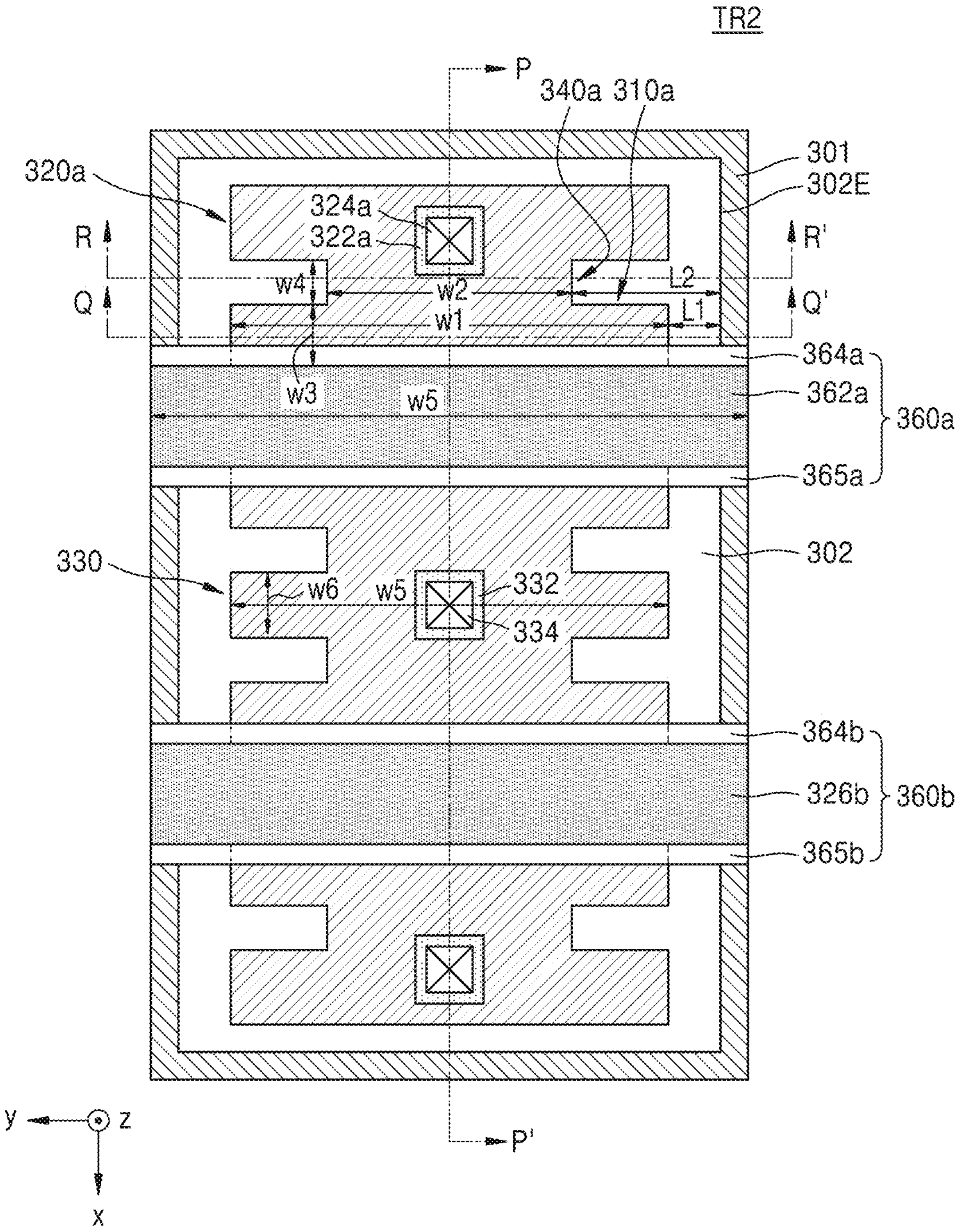
FIGS. 10A to 10D are a plan view and cross-sectional views illustrating another transistor included in a NAND flash device, according to another embodiment.
Figure 10B:
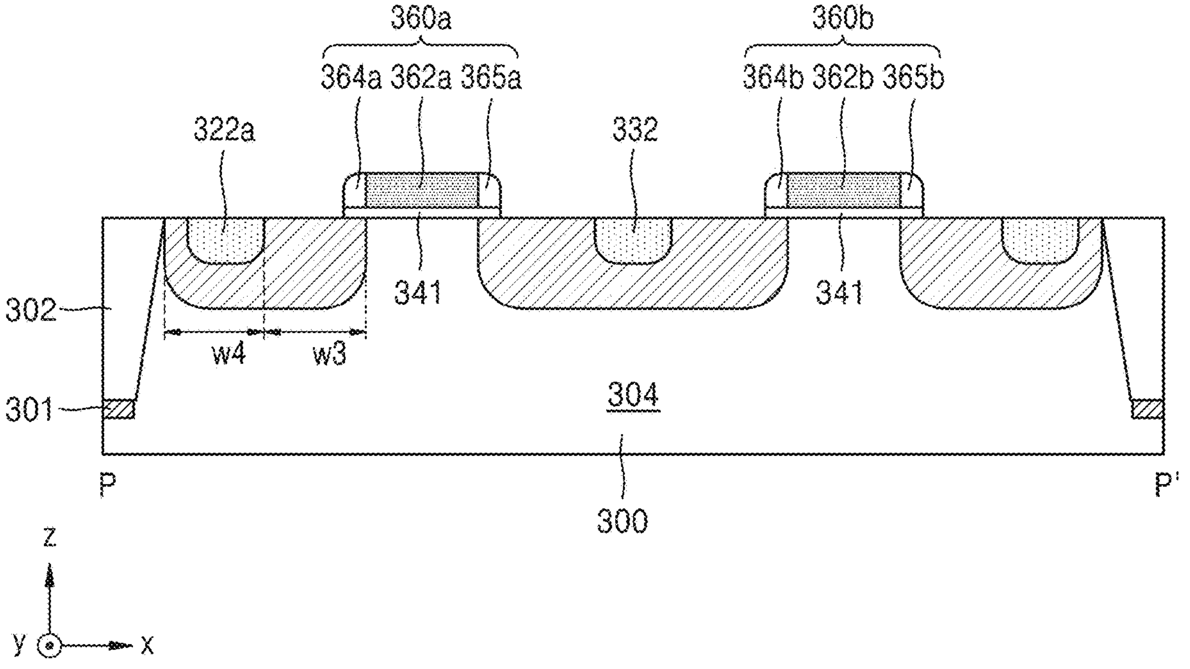
Figure 10C:
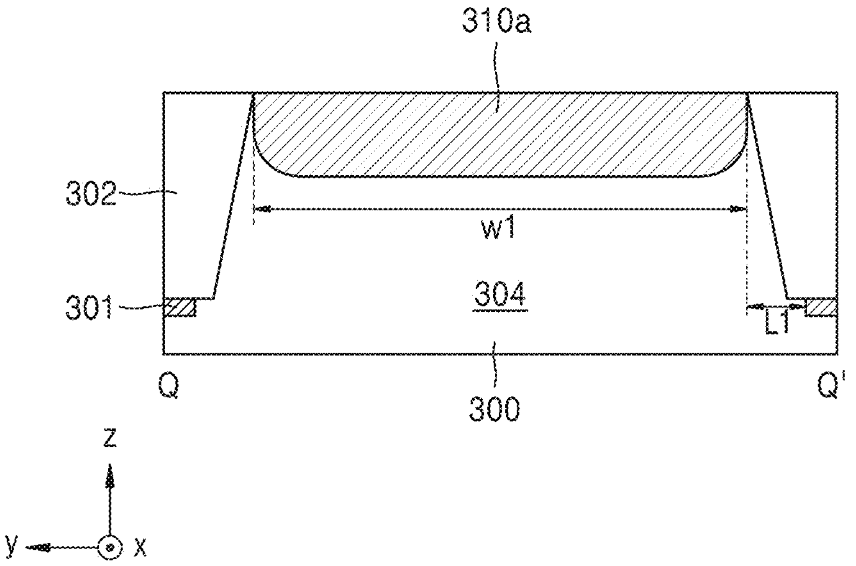
Figure 10D:
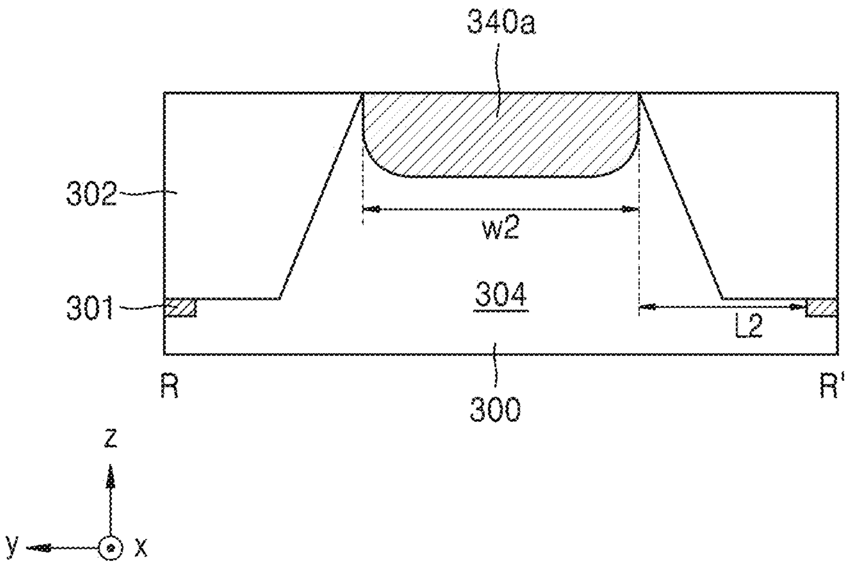

FIG. 10A is a plan view of the transistor TR2, and FIG. 10B is a cross-sectional view taken along line P-P' of FIG. 10A. In addition, FIG. 10C is a cross-sectional view taken along line Q-Q' of FIG. 10A, and FIG. 10D is a cross-sectional view taken along line R-R' of FIG. 10A.

Referring to FIGS. 10A to 10D, the transistor TR2 may further include a fourth lightly-doped source and drain region 340*a* that is integrally connected to the first lightly-doped source and drain region 310*a* adjacent to the first gate structure 360*a* and is farther than the first lightly-doped source and drain regions 310*a* from the first gate structure 360*a*. The first lightly-doped source and drain regions 310*a* may have a first width w1 in a second direction (the y direction), and the fourth lightly-doped source and drain region 340*a* may have a second width w2 in the second direction (the y direction). In this case, the second width w2 may be less than the first width w1. Accordingly, the fourth lightly-doped source and drain region 340*a* may be separated from the isolation impurity region 301 by a second separation distance L2 greater than a first separation distance L1. When the fourth lightly-doped source and drain regions 340*a* are separated from the isolation impurity region 301 by the second separation distance L2, an electric field increases in the device isolation impurity region 301 may be limited and/or prevented from increasing during an operation of the transistor TR2, and thus, it is possible to limit and/or prevent a breakdown voltage of the transistor TR2 from being lowered. However, unlike the transistor TR1 illustrated in FIGS. 9A to 9D, the fourth lightly-doped source and drain region 340*a* having a less width may not include a heavily-doped source and drain region and a source and drain contact.

The transistor TR2 may include a second lightly-doped source and drain region 320*a* that is integrally connected to the fourth lightly-doped source and drain region 340*a* and is farther than the fourth lightly-doped source and drain region 340*a* from the first gate structure 360*a*. Unlike the second lightly-doped source and drain region 320*a* of the transistor TR1, the second lightly-doped source and drain regions 320*a* of the transistor TR2 may have substantially the same upper surface area as the first lightly-doped source and drain regions 310*a*. That is, widths of the second lightly-doped source and drain region 320*a* of the transistor TR2 in the first direction and the second direction may be respectively substantially the same as the width w3 and the width w1 of the first lightly-doped source and drain region 310*a* respectively in the first direction and the second direction.

According to an embodiment, the transistor TR2 may further include a third lightly-doped source and drain region 330 between the first gate structure 360*a* and the second gate structure 360*b* separated from each other in the first direction (the x direction). A fifth width w5 of the third lightly-doped source and drain region 330 in the second direction (the y direction) may be substantially the same as the first width w1 of the first lightly-doped source and drain region 310*a*. In addition, a sixth width w6 of the third lightly-doped source and drain region 330 in the first direction (the x direction) may be substantially the same as the third width w3 of the first lightly-doped source and drain region 310*a* in the first direction (the x direction).

FIGS. 11A to 11D are a plan view and cross-sectional views illustrating a transistor included in a NAND flash device, according to another embodiment.

FIGS. 11A to 11D may illustrate one transistor TR3 among the transistors TR included in the NAND flash devices 10, 10-1, and 100 described above. FIGS. 11A to 11D illustrate the one transistor TR3 among the transistors TR included in a peripheral circuit (for example, 30 in FIG. 1) in the peripheral circuit structure PCS of the NAND flash devices 10, 10-1, and 100 described above. In FIGS. 11A to 11D, the descriptions previously given with reference to FIGS. 9A to 9D are briefly described or omitted.

Figure 11A:
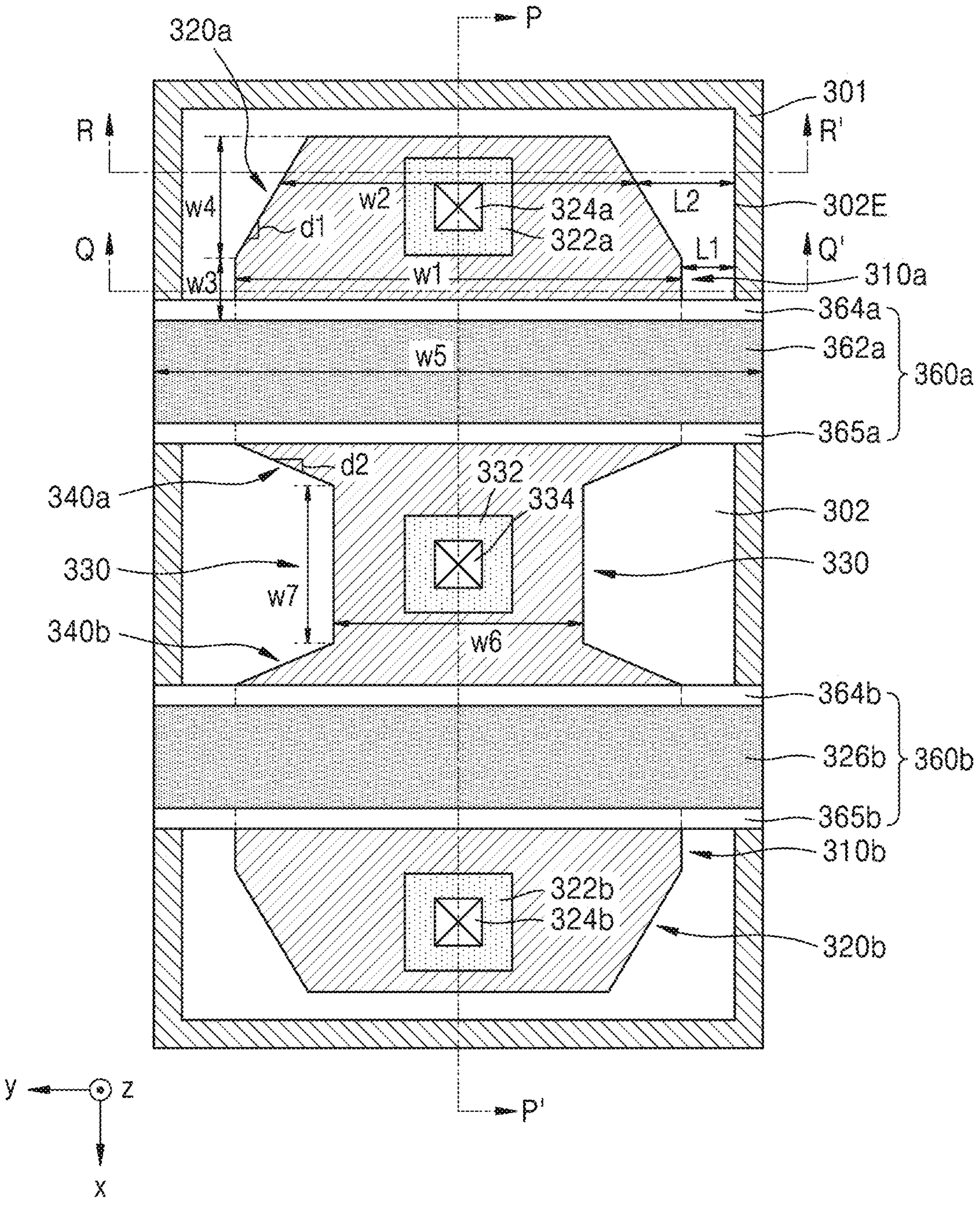
FIGS. 11A to 11D are a plan view and cross-sectional views illustrating another transistor included in a NAND flash device, according to another embodiment.
Figure 11B:
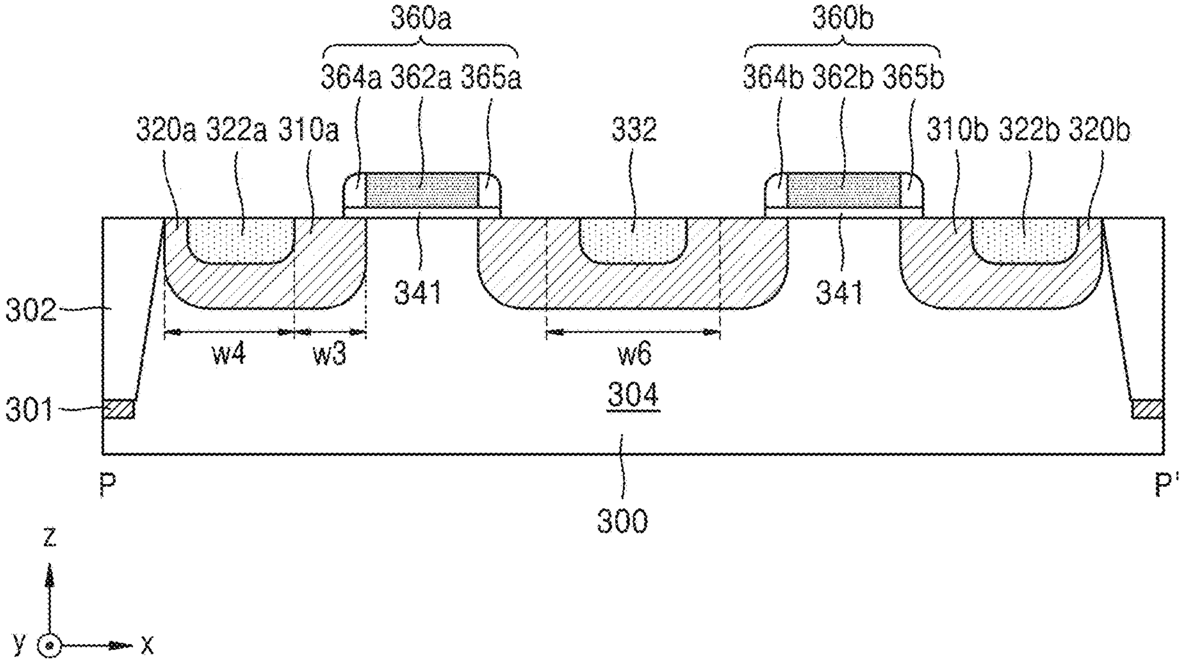
Figure 11C:
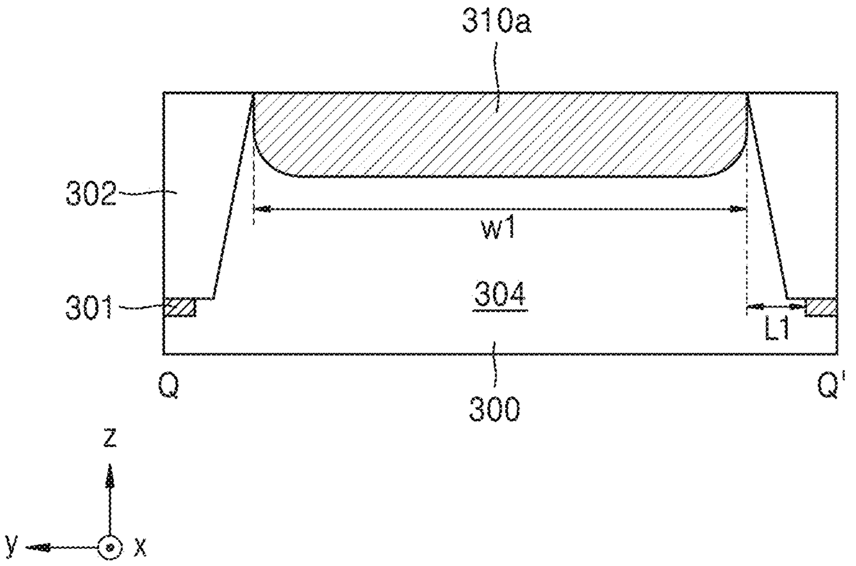
Figure 11D:
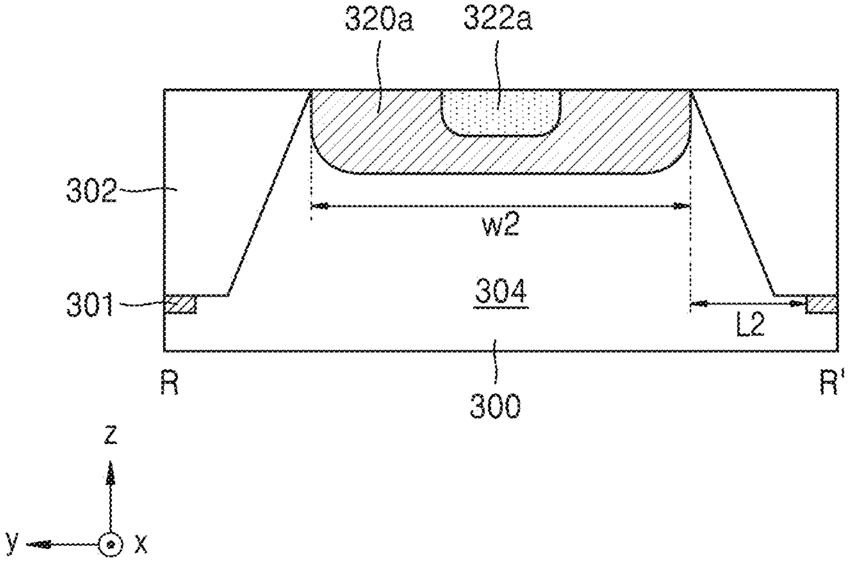

FIG. 11A is a plan view of the transistor TR3, and FIG. 11B is a cross-sectional view taken along line P-P' of FIG. 11A. In addition, FIG. 11C is a cross-sectional view taken along line Q-Q' of FIG. 11A, and FIG. 11D is a cross-sectional view taken along line R-R' of FIG. 11A.

Referring to FIGS. 11A to 11D, the transistor TR3 may include a plurality of source and drain doping regions (hereinafter, PSD of FIG. 8 hereinafter). The plurality of source and drain doping regions PSD of the transistor TR3 may include first lightly-doped source and drain regions 310*a* and 310*b* respectively adjacent to one side of the first gate structure 360*a* and one side of the second gate structure 360*b*. Unlike the transistors TR1 and TR2 according to other embodiments, the first lightly-doped source and drain regions 310*a* and 310*b* of the transistor TR3 may be respectively formed on only one side of the first gate structure 360*a* and only one side of the second gate structure 360*b*. The first lightly-doped source and drain regions 310*a* and 310*b* may each have a first width w1 in a second direction (the y direction) and a second width w2 in a first direction (the x direction). The first lightly-doped source and drain regions 310*a* and 310*b* may be separated from an isolation impurity region 301 by a first separation distance L1. The isolation impurity region 301 also may be referred to as a contact impurity region.

The transistor TR3 may include second lightly-doped source and drain regions 320*a* and 320*b* that are respectively integrally connected to the first lightly-doped source and drain regions 310*a* and 310*b* and are farther than the first lightly-doped source and drain regions 310*a* and 310*b* respectively from a first gate structure 360*a* and a second gate structure 360*b*. The second lightly-doped source and drain regions 320*a* and 320*b* may each have a second width w2 in a second direction (the y direction) and a fourth width w4 in a first direction (x direction). In this case, the second width w2 may be reduced as a distance from the first gate structure 360*a* or the second gate structure 360*b* increases. Although FIG. 11A illustrates that a first change rate d1 indicating a degree in which the second width w2 of each of the second lightly-doped source and drain regions 320*a* and 320*b* is reduced is constant, the first change rate d1 is not a constant and may not be constant depending on embodiments. The greatest value of the second width w2 of each of the second lightly-doped source and drain regions 320*a* and 320*b* may be substantially equal to the first width w1 of each of the first lightly-doped source and drain regions 310*a* and 310*b*. The second lightly-doped source and drain regions 320*a* and 320*b* may be separated from the isolation impurity region 301 by a second separation distance L2. However, the second width w2 is reduced as a distance from each of the first gate structure 360*a* and the second gate structure 360*b* increases, and accordingly, a second separation distance L2 in a first direction (the x direction) may be reduced as the distance from each of the first gate structure 360*a* and the second gate structure 360*b* increases.

The second lightly-doped source and drain regions 320*a* and 320*b* may be respectively separated from the first gate structure 360*a* and the second gate structure 360*b* to a sufficient extent not to respectively overlap the first gate structure 360*a* and the second gate structure 360*b*. However, inventive concepts are not limited thereto, and partial regions of the first gate structure 360*a* and the second gate structure 360*b* may respectively overlap partial regions of the second lightly-doped source and drain regions 320*a* and 320*b* depending on embodiments.

According to an embodiment, the transistor TR3 may include a third lightly-doped source and drain region 330 between the first gate structure 360*a* and the second gate structure 360*b*. In this case, the third lightly-doped source and drain region 330 may have a sixth width w6 in the second direction (the y direction) and a seventh width w7 in the first direction (the x direction). The sixth width w6 of the third lightly-concentrated source and drain doped region 330 may be less than the first width w1 of each of the first lightly-concentrated source and drain doped regions 310*a* and 310*b*, and the seventh width w7 of the third lightly-doped source and drain doped region 330 may be greater than the third width w3 of each of the first lightly-doped source and drain regions 310*a* and 310*b*. However, inventive concepts are not limited thereto, and the seventh width w7 may be less than the third width w3 depending on embodiments.

According to an embodiment, the transistor TR3 may include fourth lightly-doped source and drain regions 340*a* and 340*b* respectively separated from the first lightly-doped source and drain doped regions 310*a* and 310*b* respectively with the first gate structure 360*a* and the second gate structure 360*b* therebetween. Widths of the fourth lightly-doped source and drain regions 340*a* and 340*b* in the second direction (the y direction) may be reduced as distanced from the first gate structure 360*a* and the second gate structure 360*b* increase. Although FIG. 11A illustrates that a second change rate d2 indicating a degree in which a width of each of the fourth lightly-doped source and drain regions 340*a* and 340*b* in the second direction (the y direction) is reduced is constant, the second change rate d2 is not a constant and may not be constant depending on embodiments. In this case, the second change rate d2 indicating the degree in which the width of each of the fourth lightly-doped source and drain regions 340*a* and 340*b* in the second direction (the y direction) is reduced may be greater than the first change rate d1 indicating a degree in which a width of each of the second lightly-doped source and drain regions 320*a* and 320*b* in the second direction (the y direction) is reduced.

The transistor TR3 may include a heavily-doped source and drain region 332 buried in the third lightly-doped source and drain region 330. In addition, the transistor TR3 may further include a source and drain contact 334 that is on the heavily-doped source and drain regions 332 and is configured to apply a voltage to the heavily-doped source and drain regions 332, and the first gate structures 360*a* and the second gate structure 360*b* may electrically share the source and drain contact 334 on the lightly-doped source and drain regions 332.

The transistors TR1, TR2, and TR3 according to various embodiments described above may have the lightly-doped source and drain regions 310*a*, 310*b*, 320*a*, and 320*b* separated from the isolation impurity region 301 by different distances, and thus, current characteristics of the transistors TR1, TR2, and TR3 may be improved, and breakdown voltage characteristics of the transistors TR1, TR2, and TR3 may be improved.

Figure 12:
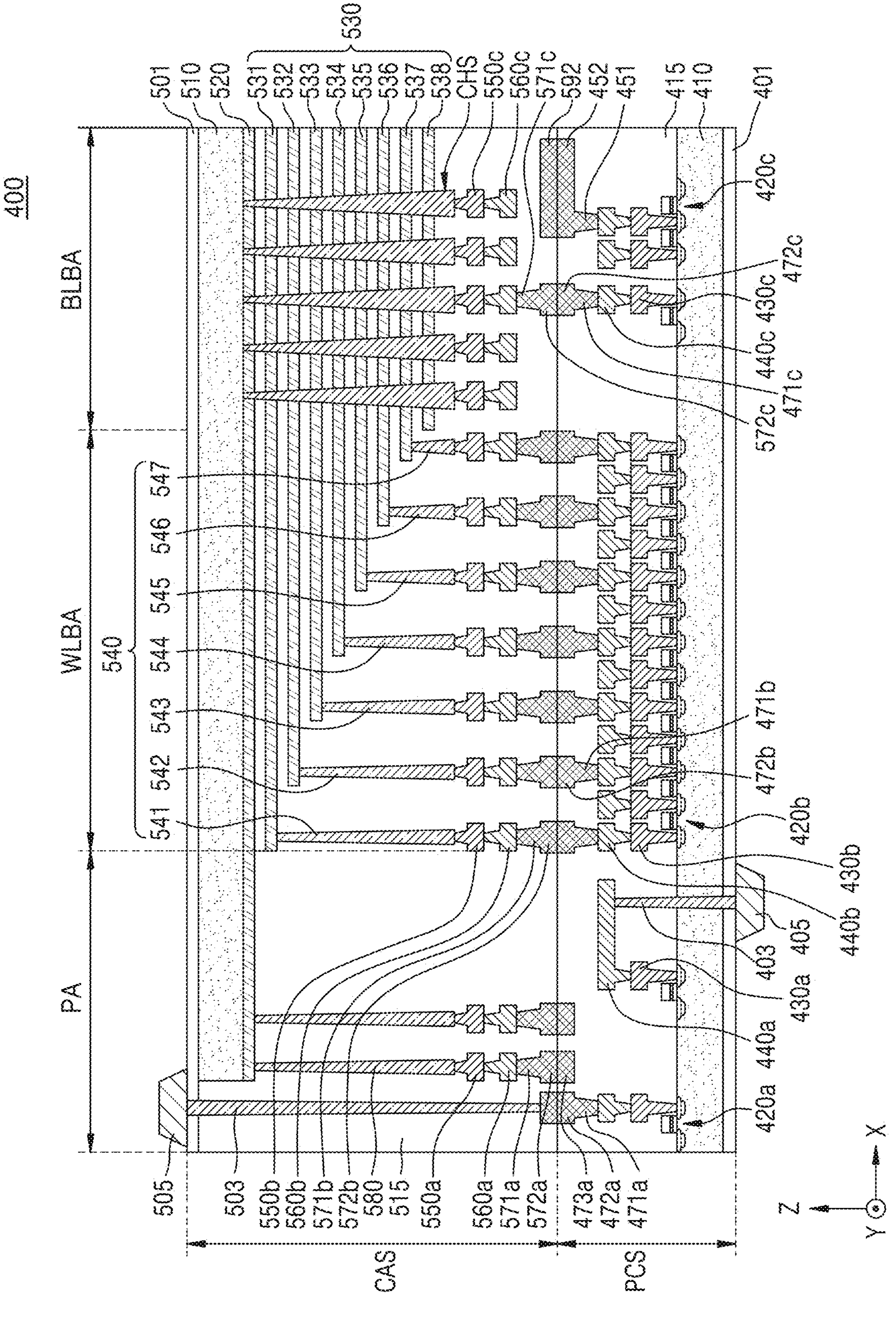
FIG. 12 is a cross-sectional view illustrating a NAND flash device according to an embodiment.

FIG. 12 is a cross-sectional view illustrating a NAND flash device according to an embodiment.

The NAND flash device 400 may have a chip to chip (C2C) structure. In the C2C structure, an upper chip including a cell array structure (CAS) is on a first wafer, a lower chip having a peripheral circuit structure (PCS) including a peripheral circuit is on a second wafer different from the first wafer, and the upper chip may be connected to the lower chip by using a bonding method.

For example, the bonding method may be used to electrically connect a bonding metal formed on an uppermost metal layer of the upper chip to a bonding metal formed on an uppermost metal layer of the lower chip. For example, when the bonding metal is formed of copper (Cu), the bonding method may be a Cu—Cu bonding method, and the bonding metal may include aluminum (Al) or tungsten (W).

Although FIG. 12 illustrated that one cell array structure CAS is bonded onto the peripheral circuit structure PCS, upper chips including a plurality of cell array structures may be bonded onto the peripheral circuit structure PCS.

Each of the peripheral circuit structure PCS and one cell array structure CAS of the NAND flash device 400 may include an external pad bonding region PA, a word line bonding region WLBA, and a bit line bonding region BLBA.

The peripheral circuit structure PCS may include a first substrate 410, an interlayer insulating layer 415, a plurality of circuit elements 420*a*, 420*b*, and 420*c* formed on the first substrate 410, first metal layers 430*a*, 430*b*, and 430*c* respectively connected to the plurality of circuit elements 420*a*, 420*b*, and 420*c*, and second metal layers 440*a*, 440*b*, and 440*c* respectively formed on the first metal layers 430*a*, 430*b*, and 430*c*.

The circuit elements 420*a*, 420*b*, and 420*c* may include the above-described transistors (TR1 of FIGS. 9A to 9D, TR2 of FIGS. 10A to 10D, and TR3 of FIGS. 11A to 11D) according to inventive concepts. In one embodiment, the first metal layers 430*a*, 430*b*, and 430*c* may be formed of tungsten having a relatively high resistivity, and the second metal layers 440*a*, 440*b*, and 440*c* may be formed of copper having a relatively low resistivity.

Although FIG. 12 illustrates only the first metal layers 430*a*, 430*b*, and 430*c* and the second metal layers 440*a*, 440*b*, and 440*c*, inventive concepts are not limited thereto, and at least one metal layer may be further formed on each of the second metal layers 440*a*, 440*b*, and 440*c*. At least one metal layer formed on each of the second metal layers 440*a*, 440*b*, and 440*c* may be formed of aluminum having a lower specific resistance than copper forming the second metal layers 440*a*, 440*b*, and 440*c*.

The interlayer insulating layer 415 may be on the first substrate 410 to cover the plurality of circuit elements 420*a*, 420*b*, and 420*c*, the first metal layers 430*a*, 430*b*, and 430*c*, and the second metal layers 440*a*, 440*b*, and 440*c*, and may include an insulating material, such as silicon oxide or silicon nitride.

Lower bonding metal layers 471*b* and 472*b* may be formed on second metal layer 440*b* in the word line bonding region WLBA. In the word line bonding region WLBA, the lower bonding metal layers 471*b* and 472*b* of the peripheral circuit structure PCS may be electrically connected to upper bonding metal layers 571*b* and 572*b* of the cell array structure CAS by a bonding method, and the lower bonding metal layers 471*b* and 472*b* and the upper bonding metal layers 571*b* and 572*b* may be formed of aluminum, copper, or tungsten.

The cell array structure CAS may provide at least one memory cell block. The cell array structure CAS may include a second substrate 510 and a common source line 520. A plurality of word lines 531 to 538 (530) may be stacked on the second substrate 510 in a direction perpendicular to an upper surface of the second substrate 510 (the Z direction). String select lines and a ground select line may be over and under the plurality of word lines 530, and the plurality of word lines 530 may be between the string select lines and the ground select line.

In the bit line bonding region BLBA, a channel structure CHS may extend in a direction (the Z direction) perpendicular to an upper surface of the second substrate 510 and penetrate the plurality of word lines 530, the string select lines, and the ground select line. The channel structure CHS may include a data storage layer, a channel layer, and a buried insulating layer, and the channel layer may be electrically connected to a first metal layer 550*c* and a second metal layer 560*c*. For example, the first metal layer 550*c* may be a bit line contact, and the second metal layer 560*c* may be a bit line 560*c*. In one embodiment, the bit line may extend in a second direction (the Y direction) parallel to the upper surface of the second substrate 510.

In one embodiment, a region where the channel structure CHS, the bit line 560*c*, and so on are arranged may be defined as the bit line bonding region BLBA. The bit line 560*c* may be electrically connected to circuit elements 420*c* in the peripheral circuit structure PCS of the bit line bonding region BLBA. For example, the bit line 560*c* may be connected to upper bonding metal layers 571*c* and 572*c* in the peripheral circuit structure PCS, and the upper bonding metal layers 571*c* and 572*c* may be connected to lower bonding metal layers 471*c* and 472*c* connected to the circuit elements 420*c*.

In the word line bonding region WLBA, the plurality of word lines 530 may extend in a first direction (the X direction) parallel to the upper surface of the second substrate 510 and may be connected to a plurality of cell contact plugs 541 to 547 (540). The plurality of word lines 530 and the plurality of cell contact plugs 540 may be connected to pads provided by extending at least some of the word lines 530 with different lengths in the first direction (the X direction). A first metal layer 550*b* and a second metal layer 560*b* may be sequentially connected to an upper portion of each of the plurality of cell contact plugs 540 connected to the plurality of word lines 530. The plurality of cell contact plugs 540 may be connected to the peripheral circuit structure PCS through the upper bonding metal layers 571*b* and 572*b* of the cell array structure CAS in the word line bonding region WLBA and the lower bonding metal layers 471*b* and 472*b* of the peripheral circuit structure PCS in the word line bonding region WLBA. The plurality of cell contact plugs 540 may be electrically connected to the circuit elements 420*b* of the peripheral circuit structure PCS.

Common source line contact plugs 580 may be in the external pad bonding region PA. The common source line contact plugs 580 may be formed of a conductive material such as a metal, a metal compound, or polysilicon, and may be electrically connected to the common source line 520. The first metal layer 550*a* and the second metal layer 560*a* may be sequentially stacked on the common source line contact plug 580. For example, a region where the common source line contact plugs 580, the first metal layers 550*a*, and the second metal layers 560*a* are arranged may be defined as the external pad bonding region PA.

The lower bonding metal layers 471*a* and 472*a* may be formed in the external pad bonding region PA. In the external pad bonding region PA, the lower bonding metal layers 471*a* and 472*a* of the peripheral circuit structure PCS may be electrically connected to the upper bonding metal layers 571*a* and 572*a* of the cell array structure CAS by a bonding method, and the lower bonding metal layers 471*a* and 472*a* and the upper bonding metal layers 571*a* and 572*a* may be formed of aluminum, copper, or tungsten.

In addition, a first input/output pad 405 and a second input/output 505 may be in the external pad bonding region PA. A lower insulating layer 401 covering a lower surface of the first substrate 410 may be formed under the first substrate 410, and the first input/output pad 405 may be formed on the lower insulating layer 401. The first input/output pad 405 may be connected to at least one of the plurality of circuit elements 420*a*, 420*b*, and 420*c* arranged in the peripheral circuit structure PCS through a first input/output contact plug 403, and may be separated from the first substrate 410 by the lower insulating layer 401. In addition, a side insulating layer may be between the first input/output contact plug 403 and the first substrate 410 to electrically separate the first input/output contact plug 403 from the first substrate 410.

An upper insulating layer 501 covering the upper surface of the second substrate 510 may be formed on the second substrate 510, and the second input/output pads 505 may be on the upper insulating layer 501. The second input/output pad 505 may be connected to at least one of the plurality of circuit elements 420*a*, 420*b*, and 420*c* in the peripheral circuit structure PCS through the second input/output contact plug 503.

In one embodiment, the second substrate 510 and a common source line 520 may not be in a region where the second input/output contact plug 503 is arranged. In addition, the second input/output pad 505 may not overlap the plurality of word lines 530 in a third direction (the Z direction). The second input/output contact plug 503 may be separated from the second substrate 510 in a direction parallel to the upper surface of the second substrate 510 and may be connected to the second input/output pad 505 by penetrating the interlayer insulating layer 515 of the cell array structure CAS.

In some embodiments, the first input/output pad 405 and the second input/output pad 505 may be selectively formed. For example, the NAND flash device 400 may include only the first input/output pad 405 over the first substrate 410 or may include only the second input/output pad 505 over the second substrate 510. Alternatively, the NAND flash device 400 may also include both the first input/output pad 405 and the second input/output pad 505.

In each of the external pad bonding region PA and the bit line bonding region BLBA included in each of the cell array structure CAS and the peripheral circuit structure PCS, a metal pattern of the uppermost metal layer may be formed as a dummy pattern, or the uppermost metal layer may not be formed.

In the external pad bonding region PA of the NAND flash device 400, the lower metal patterns 472*a* and 473*a* having the same shape as the upper metal pattern 572*a* of the cell array structure CAS may be formed on the uppermost metal layer of the peripheral circuit structure PCS to correspond to the upper metal pattern 572*a* formed on the uppermost metal layer of the cell array structure CAS. The lower metal pattern 473*a* formed on the uppermost metal layer of the peripheral circuit structure PCS may not be connected to a separate contact in the peripheral circuit structure PCS. Similarly, in the external pad bonding region PA, the upper metal pattern 572*a* having the same shape as the lower metal pattern 473*a* of the peripheral circuit structure PCS may be formed on the upper metal layer of the cell array structure CAS to correspond to the lower metal pattern 473*a* formed on the uppermost metal layer of the peripheral circuit structure PCS.

The lower bonding metal layers 471*b* and 472*b* may be formed on the second metal layer 440*b* of the word line bonding region WLBA. In the word line bonding region WLBA, the lower bonding metal layers 471*b* and 472*b* of the peripheral circuit structure PCS may be electrically connected to the upper bonding metal layers 571*b* and 572*b* of the cell array structure CAS by a bonding method.

In addition, in the bit line bonding region BLBA, an upper metal pattern 592 having the same shape as a lower metal pattern 452 of the peripheral circuit structure PCS may be formed on the uppermost metal layer of the cell array structure CAS to correspond to the lower metal pattern 452 formed on the uppermost metal layer of the peripheral circuit structure PCS. A contact may not be formed on the upper metal pattern 592 formed on the uppermost metal layer of the cell array structure CAS. The lower metal pattern 452 of the peripheral circuit structure PCS may be electrically connected to the circuit element 420*c* through a metal layer 451.

Figure 13:
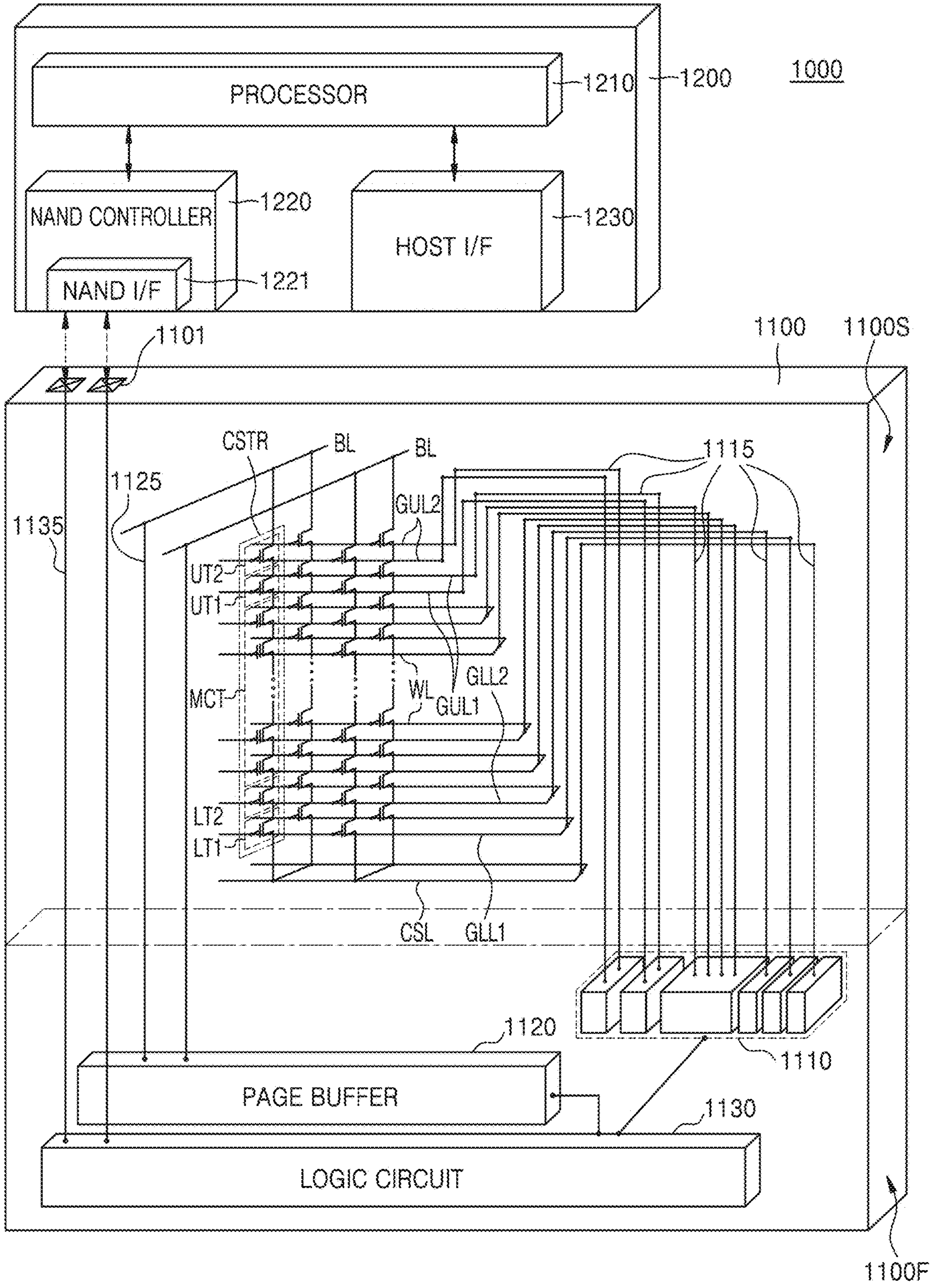
FIG. 13 schematically illustrates an electronic system including a NAND flash device, according to inventive concepts.

FIG. 13 schematically illustrates an electronic system including a NAND flash device, according to inventive concepts.

An electronic system 1000 according to an example embodiment may include a NAND flash device 1100 and a controller 1200 electrically connected to the NAND flash device 1100. The electronic system 1000 may be a storage device including one or a plurality of NAND flash devices 1100, or an electronic device including the storage device. For example, the electronic system 1000 may be a solid state drive (SSD) device including at least one NAND flash device 1100, a Universal Serial Bus (USB), a computing system, a medical device, or a communication device.

The NAND flash device 1100 may be a nonvolatile memory device. For example, the NAND flash device 1100 may be a NAND flash memory device including at least one of the structures described above for the NAND flash devices 10, 10-1, 100, and 400. The NAND flash device 1100 may include a first structure 1100F and a second structure 1100S on the first structure 1100F. In example embodiments, the first structure 1100F may be on a side of the second structure 1100S. The first structure 1100F may be a peripheral circuit structure including a decoder circuit 1110, a page buffer 1120, and a logic circuit 1130. The second structure 1100S may include a plurality of bit lines BL, a common source line CSL, a plurality of word lines WL, first and second gate upper lines GUL1 and GUL2, and first and second gate lower lines GLL1 and GLL2, and a plurality of memory cell strings CSTR between the plurality of bit lines BL and the common source line CSL.

In the second structure 1100S, the plurality of memory cell strings CSTR may each include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified depending on embodiments.

In example embodiments, the upper transistors UT1 and UT2 may each include a string select transistor, and the lower transistors LT1 and LT2 may each include a ground select transistor. The first and second gate lower lines GLL1 and GLL2 may be respectively gate electrodes of the lower transistors LT1 and LT2. The plurality of word lines WL may be respectively gate electrodes of the plurality of memory cell transistors MCT, and the first and second gate upper lines GUL1 and GUL2 may be respectively gate electrodes of the upper transistors UT1 and UT2.

The common source line CSL, the first and second gate lower lines GLL1 and GLL2, the plurality of word lines WL, and the first and second gate upper lines GUL1 and GUL2 may be electrically connected to the decoder circuit 1110 through a plurality of first connection wires 1115 extending from the first structure 1100F to the second structure 1100S. The plurality of bit lines BL may be electrically connected to the page buffer 1120 through a plurality of second connection wires 1125 extending from the first structure 1100F to the second structure 1100S.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The NAND flash device 1100 may communicate with the controller 1200 through input/output pads 1101 electrically connected to the logic circuit 1130. The input/output pads 1101 may be electrically connected to the logic circuit 1130 through input/output connection wires 1135 extending from the first structure 1100F to the second structure 1100S.

The controller 1200 may include a processor 1210, a NAND controller 1220, and a host interface 1230. According to embodiments, the electronic system 1000 may include a plurality of NAND flash devices 1100, and in this case, the controller 1200 may control the plurality of NAND flash devices 1100.

The processor 1210 may control all operations of the electronic system 1000 including the controller 1200. The processor 1210 may operate according to desired and/or alternatively preset firmware and may access the NAND flash device 1100 by controlling the NAND controller 1220. The NAND controller 1220 may include a NAND interface 1221 that communicates with the NAND flash device 1100. A control command for controlling the NAND flash device 1100, data to be written to the plurality of memory cell transistors MCT of the NAND flash device 1100, and data to be read from the plurality of memory cell transistors MCT of the NAND flash device 1100, and so on may be transmitted through the NAND interface 1221. The host interface 1230 may provide a communication function between the electronic system 1000 and an external host. When receiving the control command from the external host through the host interface 1230, the processor 1210 may control the NAND flash device 1100 in response to the control command.

Figure 14:
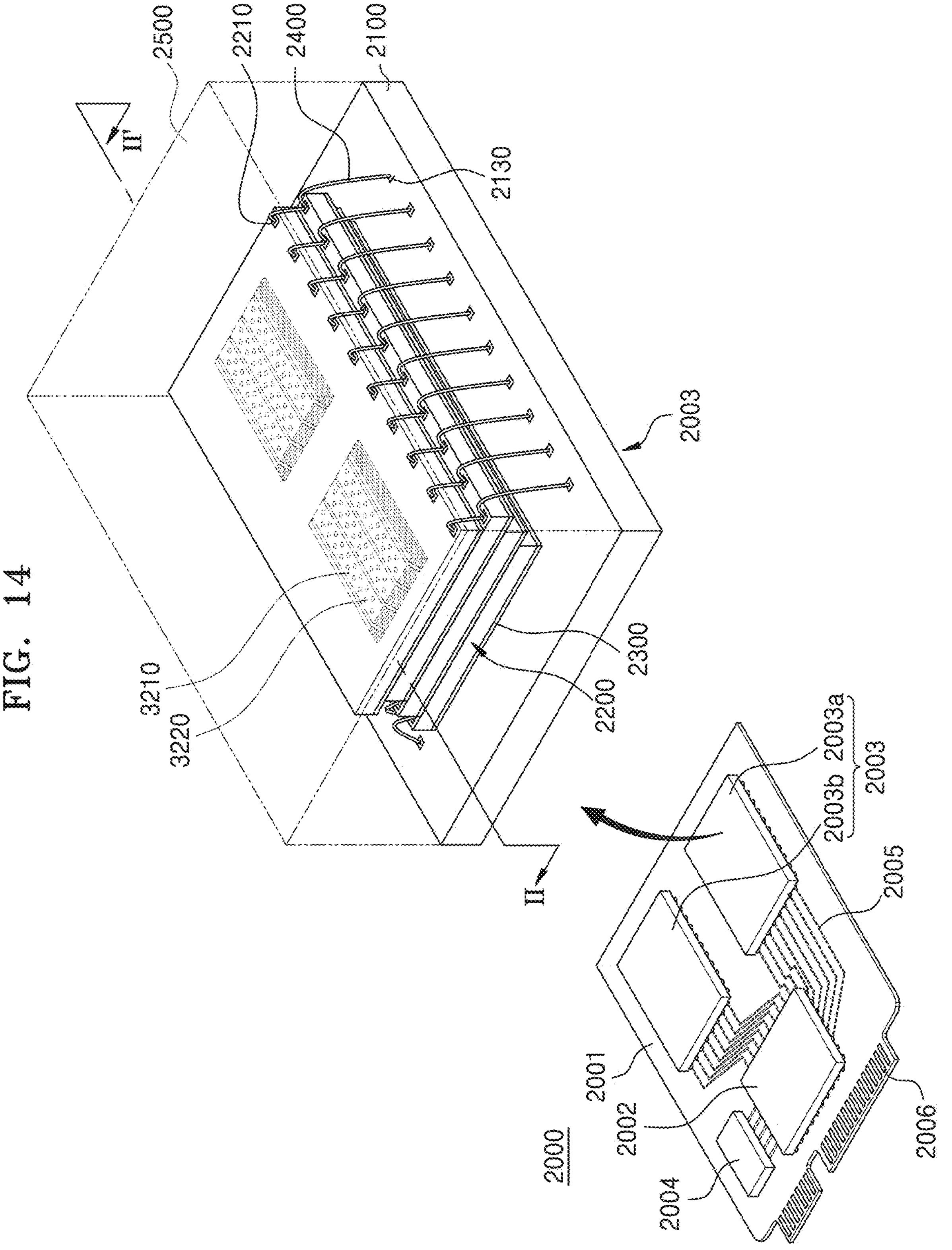
FIG. 14 is a perspective view schematically illustrating an electronic system including a NAND flash device, according to an embodiment.

FIG. 14 is a perspective view schematically illustrating an electronic system including a NAND flash device, according to an embodiment.

An electronic system 2000 according to an example embodiment may include a main board 2001, a controller 2002 mounted on the main board 2001, one or more semiconductor packages 2003, and dynamic random access memory (DRAM) 2004. The one or more semiconductor packages 2003 and the DRAM 2004 may be connected to the controller 2002 through a plurality of wiring patterns 2005 formed on the main board 2001.

The main board 2001 may include a connector 2006 including a plurality of pins coupled to an external host. The number and arrangement of the plurality of pins in the connector 2006 may change according to a communication interface between the electronic system 2000 and the external host. In example embodiments, the electronic system 2000 may communicate with the external host according to any one of interfaces, such as Universal Serial Bus (USB), peripheral component interconnect express (PCI-Express), serial advanced technology attachment (SATA), and M-Phy for universal flash storage (UFS). In example embodiments, the electronic system 2000 may be operated by power supplied from the external host through the connector 2006. The electronic system 2000 may further include a power management integrated circuit (PMIC) that distributes the power supplied from the external host to the controller 2002 and the one or more semiconductor packages 2003.

The controller 2002 may write data to the one or more semiconductor packages 2003 or read data from the one or more semiconductor packages 2003 and may increase an operating speed of the electronic system 2000.

The DRAM 2004 may be a buffer memory for reducing a speed difference between the one or more semiconductor packages 2003, which are a data storage space, and the external host. The DRAM 2004 included in the electronic system 2000 may operate as a kind of cache memory and may provide a space for temporarily storing data in a control operation for the semiconductor package 2003. When the electronic system 2000 includes the DRAM 2004, the controller 2002 may further include a DRAM controller for controlling the DRAM 2004 in addition to the NAND controller for controlling the one or more semiconductor packages 2003.

The one or more semiconductor packages 2003 may include first and second semiconductor packages 2003*a* and 2003*b* separated from each other. The first and second semiconductor packages 2003*a* and 2003*b* may each include a plurality of semiconductor chips 2200. Each of the first and second semiconductor packages 2003*a* and 2003*b* may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include input/output pads 2210. The input/output pads 2210 may correspond to the input/output pads 1101 of FIG. 13. Each of the plurality of semiconductor chips 2200 may include a plurality of gate stacks 3210 and a plurality of channel structures 3220. Each of the plurality of semiconductor chips 2200 may include at least one of the NAND flash devices 10, 10-1, 100, and 400 described above.

In example embodiments, the connection structure 2400 may include bonding wires respectively electrically connecting the input/output pads 2210 to the package upper pads 2130. Accordingly, in the first and second semiconductor packages 2003*a* and 2003*b*, the plurality of semiconductor chips 2200 may be electrically connected to each other by using a bonding wire method and may be electrically connected to the upper package pads 2130 of the package substrate 2100. In example embodiments, in the first and second semiconductor packages 2003*a* and 2003*b*, the plurality of semiconductor chips 2200 may also be electrically connected to each other by a connection structure including through silicon vias (TSVs) instead of the connection structure 2400 of a bonding wire type.

In example embodiments, the controller 2002 and the plurality of semiconductor chips 2200 may be included in one package. In example embodiments, the controller 2002 and the plurality of semiconductor chips 2200 may be mounted on a separate interposer substrate different from the main board 2001, and the controller 2002 may be connected to the plurality of semiconductor chips 2200 by wires formed on the interposer substrate.

Figure 15:
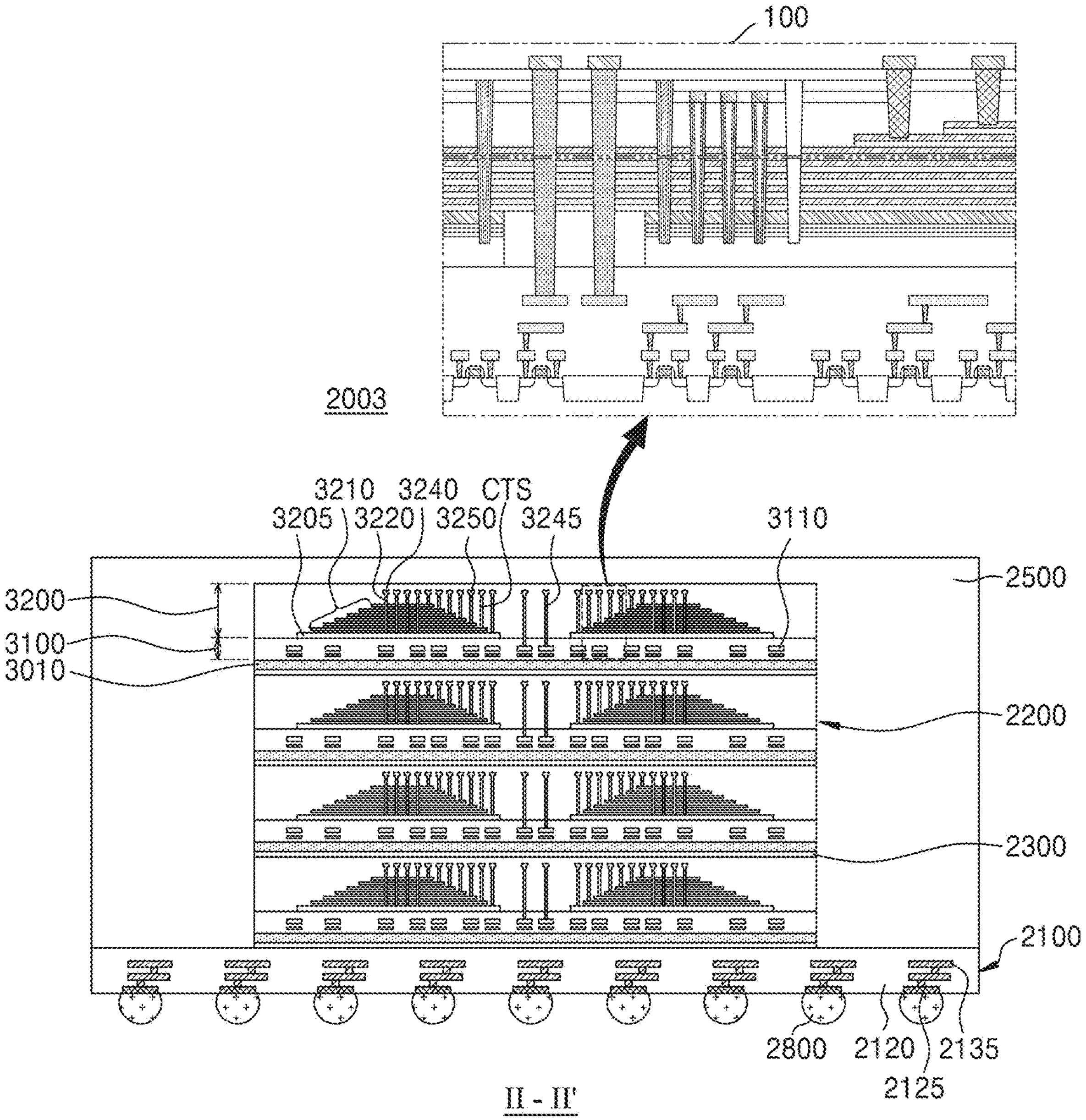
FIG. 15 is a schematic cross-sectional view illustrating semiconductor packages according to an embodiment.

FIG. 15 is a cross-sectional view schematically illustrating semiconductor packages according to an embodiment. FIG. 15 illustrates in more detail a configuration taken along line II'II' of FIG. 14.

The package substrate 2100 of the semiconductor package 2003 may be a printed circuit board. The package substrate 2100 may include a package substrate body 2120, the plurality of package upper pads 2130 on an upper surface of the package substrate body 2120 (see FIG. 12), a plurality of lower pads 2125 arranged on a lower surface of the package substrate body 2120 or exposed through the lower surface, and a plurality of internal wires 2135 electrically connecting the plurality of upper pads 2130 to the plurality of lower pads 2125 in the package substrate body 2120. The plurality of upper pads 2130 may be respectively electrically connected to the plurality of connection structures 2400. The plurality of lower pads 2125 may be connected to the plurality of wiring patterns 2005 on the main board 2001 of the electronic system 2000 illustrated in FIG. 12 through the plurality of conductive connection portions 2800.

Each of the plurality of semiconductor chips 2200 may include a semiconductor substrate 3010, and a first structure 3100 and a second structure 3200 sequentially stacked on the semiconductor substrate 3010. The first structure 3100 may include a peripheral circuit region including a plurality of peripheral wires 3110. The second structure 3200 may include a common source line 3205, a gate stack 3210 on the common source line 3205, channel structures 3220 passing through the gate stack 3210, and bit lines 3240 respectively electrically connected to the channel structures 3220. In example embodiments, each of the plurality of semiconductor chips 2200 may include the same configuration as described for the NAND flash devices 100, 100-1, 200, and 400 described above.

Each of the plurality of semiconductor chips 2200 may include through-wires 3245 electrically connected to a plurality of peripheral wires 3110 and extending into the second structure 3200. The through-wires 3245 may be outside the gate stack 3210. In other example embodiments, the semiconductor package 2003 may further include through-wires passing through the gate stack 3210. Each of the plurality of semiconductor chips 2200 may further include input/output pads (2210 in FIG. 12) electrically connected to the plurality of peripheral wires 3110 of the first structure 3100.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some embodiments of inventive concepts have been particularly shown and described with reference to embodiments thereof, it will be understood that various changes in form and details may be made therein without departing from the spirit and scope of the following claims.

What is claimed is:

1. A NAND flash device comprising:

a peripheral circuit including a transistor, a substrate, and a device isolation region on the substrate, wherein the device isolation region defines an active region of the substrate, the transistor includes a first gate structure on the active region, the transistor includes a plurality of source and drain regions extending in a first direction in the active region on both sides of the first gate structure, the plurality of source and drain regions include a first lightly-doped source and drain region and a second lightly-doped source and drain region, the first lightly-doped source and drain region is adjacent to the first gate structure and has a first width in a second direction, the second direction is perpendicular to the first direction, the second lightly-doped source and drain region is integrally connected to the first lightly-doped source and drain region, the second lightly-doped source and drain region is arranged farther from the first gate structure than the first lightly-doped source and drain region, the second lightly-doped source and drain region has a second width in the second direction, the second width is less than the first width, the peripheral circuit includes an isolation impurity region in the substrate, and the isolation impurity region surrounds the plurality of source and drain regions when viewed from a third direction perpendicular to an upper surface of the active region.

2. The NAND flash device of claim 1, wherein
the first lightly-doped source and drain region has a third width in the first direction,
the second lightly-doped source and drain region has a fourth width in the first direction, and
the fourth width is greater than or equal to the third width.

3. The NAND flash device of claim 1, wherein a part of the first lightly-doped source and drain region overlaps the first gate structure.

4. The NAND flash device of claim 1,
wherein
the plurality of source and drain regions include a first heavily-doped source and drain region buried in the second lightly-doped source and drain region,
the peripheral circuit includes a first source and drain contact on the first heavily-doped source and drain region, and
the first source and drain contact is configured to apply a voltage to the first heavily-doped source and drain region.

5. The NAND flash device of claim 1, wherein
a first separation distance in the second direction between the first lightly-doped source and drain region and the isolation impurity region is less than a second separation distance in the second direction between the second lightly-doped source and drain region and the isolation impurity region.

6. The NAND flash device of claim 5, wherein
the first lightly-doped source and drain region and the second lightly-doped source and drain region include an impurity of a first conductivity type,
the isolation impurity region includes an impurity of a second conductivity type,
the second conductivity type is different from the first conductivity type.

7. The NAND flash device of claim 1, wherein
the first gate structure has a fifth width in the second direction, and
the fifth width is greater than the second width of the second lightly-doped source and drain region in the second direction.

8. The NAND flash device of claim 1, wherein
the active region includes a tapered trench,
the device isolation region is in the tapered trench, and
the plurality of source and drain regions are surrounded by the device isolation region.

9. The NAND flash device of claim 1, wherein
the peripheral circuit includes a second gate structure separated from the first gate structure in the first direction,
the active region includes a third lightly-doped source and drain region in a portion of the substrate, and
when viewed from a third direction perpendicular to an upper surface of the active region, the third lightly-doped source and drain region is between the first gate structure and the second gate structure and a width of the third lightly-doped source and drain region in the second direction is equal to the first width in the second direction.

10. The NAND flash device of claim 9, wherein
the active region includes a second heavily-doped source and drain region buried in the third lightly-doped source and drain region, and
the peripheral circuit includes a second source and drain contact on the second heavily-doped source and drain region and configured to apply a voltage to the second heavily-doped source and drain region.

11. A NAND flash device comprising:
a peripheral circuit including a plurality of transistors, a substrate, and a device isolation region on the substrate, wherein
the device isolation region defines an active region of the substrate,
each of the plurality of transistors includes a pair of gate structures arranged side by side in a first direction on the active region and a plurality of source and drain regions in the active region,
the pair of gate structures are separated from each other and extend in a second direction,
the second direction is perpendicular to the first direction,
the plurality of source and drain regions extend respectively in the first direction and the second direction in the active region on both sides of each of the pair of gate structures,
the plurality of source and drain regions include a first lightly-doped source and drain region and a second lightly-doped source and drain region integrally connected to the first lightly-doped source and drain region,
the first lightly-doped source and drain region is in the active region on the both sides of each of the pair of gate structures, with the pair of gate structures therebetween when view from a third direction perpendicular to an upper surface of the active region,
the first lightly-doped source and drain region has a first width in the second direction,
the second lightly-doped source and drain region is arranged farther from the pair of gate structures than the first lightly-doped source and drain region,
the second lightly-doped source and drain region has a second width in the second direction, and
the second width is reduced as a distance increases from the pair of gate structures.

12. The NAND flash device of claim 11, wherein a greatest width of the second lightly-doped source and drain region in the second direction is equal to the first width of the first lightly-doped source and drain region.

13. The NAND flash device of claim 11, wherein the second lightly-doped source and drain region does not vertically overlap the pair of gate structures.

14. The NAND flash device of claim 11, wherein
the pair of gate structures have a fifth width in the second direction, and
the fifth width is greater than the second width of the second lightly-doped source and drain region in the second direction.

15. The NAND flash device of claim 11, wherein
the active region includes third lightly-doped source and drain region between the pair of gate structures, when viewed from the third direction, wherein
a width of the third lightly-doped source and drain region in the first direction is greater than a width of the first lightly-doped source and drain region in the first direction, and
a width of the third lightly-doped source and drain region in the second direction is less than the second width of the second lightly-doped source and drain region in the second direction.

16. The NAND flash device of claim 15, wherein
the active region includes a fourth lightly-doped source and drain region between the first lightly-doped source and drain region and the third lightly-doped source and drain region, when view from the third direction, a width of the fourth lightly-doped source and drain region is reduced in the second direction as a distance from the third lightly-doped source and drain region decreases, and a change rate of the width of the fourth lightly-doped source and drain region in the second direction is greater than a change rate of the width of the second lightly-doped source and drain region in the second direction.

17. The NAND flash device of claim 15, wherein the active region includes a heavily-doped source and drain region buried in the third lightly-doped source and drain region, and the peripheral circuit includes a source and drain contact on the heavily-doped source and drain region, the source and drain contact is configured to apply a voltage to the heavily-doped source and drain region, and the source and drain contact is electrically shared by the pair of gate structures.

18. The NAND flash device of claim 11, wherein the peripheral circuit includes an isolation impurity region surrounding the plurality of source and drain regions when viewed from the third direction perpendicular, a first separation distance in the second direction between the first lightly-doped source and drain region and the isolation impurity region is less than a second separation distance in the second direction between the second lightly-doped source and drain region and the isolation impurity region, and the second separation distance increases as a distance of the second lightly-doped source and drain region from each of the pair of gate structures in the first direction increases.

19. A NAND flash device comprising:

a peripheral circuit including a plurality of transistors on a substrate; and a memory cell array configured to controlled by the peripheral circuit, wherein the peripheral circuit includes a tapered trench in the substrate, a device isolation region in the tapered trench and defining an active region of the substrate, a pair of gate structures arranged side by side in a first direction on the active region, and a source and drain region in the active region, the pair of gate structures are separated from each other and extend in a second direction, the second direction is perpendicular to the first direction, the source and drain region extends in the first direction in the active region on both sides of each of the pair of gate structures, the source and drain region includes a lightly-doped source and drain region and a first heavily-doped source and drain region, the lightly-doped source and drain region includes a first lightly-doped source and drain region in the substrate in a region adjacent to each of the pair of gate structures and a second lightly-doped source and drain region farther from each of the pair of gate structures than the first lightly-doped source and drain region, the first heavily-doped source and drain region is in the second lightly-doped source and drain region, the first heavily-doped source and drain region is more heavily doped than the lightly-doped source and drain region, the first lightly-doped source and drain region has a first width in the first direction and a second width in the second direction, the second lightly-doped source and drain region has a third width in the first direction and a fourth width in the second direction, the first width is less than the third width, the second width is greater than the fourth width, the peripheral circuit includes an isolation impurity region in the substrate, and the isolation impurity region surrounds the source and drain region when viewed from a third direction perpendicular to an upper surface of the source and drain region.

20. The NAND flash device of claim 19, wherein a first separation distance in the second direction between the first lightly-doped source and drain region and the isolation impurity region is less than a second separation distance in the second direction between the second lightly-doped source and drain region and the isolation impurity region, the first lightly-doped source and drain region and the second lightly-doped source and drain region include an impurity of a first conductivity type, the isolation impurity region includes an impurity of a second conductivity type, and the second conductivity type is different from the first conductivity type.

* * * * *